United States Patent
Kimura et al.

(10) Patent No.: US 12,301,144 B2
(45) Date of Patent: May 13, 2025

(54) TRANSPORT SYSTEM AND CONTROL METHOD OF TRANSPORT SYSTEM

(71) Applicant: CANON KABUSHIKI KAISHA, Tokyo (JP)

(72) Inventors: Ryuji Kimura, Kanagawa (JP); Tatsuya Shinkai, Tokyo (JP); Takeshi Yamamoto, Kanagawa (JP); Mitsuharu Ezawa, Kanagawa (JP); Kazushi Shimomura, Kanagawa (JP); Tomohiro Mizuno, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 491 days.

(21) Appl. No.: 17/498,641

(22) Filed: Oct. 11, 2021

(65) Prior Publication Data
US 2022/0140762 A1 May 5, 2022

(30) Foreign Application Priority Data
Oct. 30, 2020 (JP) .................. 2020-182799

(51) Int. Cl.
*H02P 25/064* (2016.01)
*H01L 21/677* (2006.01)
*H02K 41/03* (2006.01)

(52) U.S. Cl.
CPC ...... *H02P 25/064* (2016.02); *H01L 21/67709* (2013.01); *H01L 21/67715* (2013.01); *H02K 41/031* (2013.01)

(58) Field of Classification Search
CPC ............ H02P 25/064; H01L 21/67709; H01L 21/67715; H02K 41/031
See application file for complete search history.

(56) References Cited

U.S. PATENT DOCUMENTS

| | | | |
|---|---|---|---|
| 4,727,813 A | 3/1988 | Matsuo |
| 5,906,262 A | 5/1999 | Miki |
| (Continued) | | |

FOREIGN PATENT DOCUMENTS

| | | |
|---|---|---|
| CN | 105151803 A | 12/2015 |
| CN | 106032219 A | 10/2016 |
| (Continued) | | |

OTHER PUBLICATIONS

Chinese Office Action issued Jan. 12, 2024 during prosecution of related Chinese application No. 202111244233.2 (English language translation included).

(Continued)

*Primary Examiner* — Zoheb S Imtiaz
(74) *Attorney, Agent, or Firm* — VENABLE LLP

(57) ABSTRACT

There is provided a transport system comprising: a stator having a first magnetic force unit; a mover having a second magnetic force unit; and a control unit. The control unit controls a magnetic force acting between the first magnetic force unit and the second magnetic force unit to transport the mover in a first direction. The stator has a first regulating member row including a plurality of first regulating members and a second regulating member row including a plurality of second regulating members, the mover, in a second direction intersecting the first direction, being disposed between the first regulating member row and the second regulating member row. The control unit performs a first process of applying a rotational force to the mover such that one of the first regulating members in the first regulating member row serves as a fulcrum when the mover contacts the first regulating member row.

14 Claims, 19 Drawing Sheets

(56) References Cited

U.S. PATENT DOCUMENTS

| | | |
|---|---|---|
| 10,118,774 B2 | 11/2018 | Tomoda et al. |
| 10,294,042 B2 | 5/2019 | Tomoda et al. |
| 10,370,279 B2 | 8/2019 | Ezawa |
| 10,562,720 B2 | 2/2020 | Yamamoto |
| 10,581,308 B2 | 3/2020 | Yamamoto |
| 10,625,948 B2 | 4/2020 | Fujii et al. |
| 10,669,106 B2 | 6/2020 | Yamamoto |
| 10,745,203 B2 | 8/2020 | Tomoda et al. |
| 10,889,449 B2 | 1/2021 | Umeyama et al. |
| 10,944,314 B2 | 3/2021 | Yamamoto |
| 10,965,201 B2 | 3/2021 | Ota et al. |
| 11,179,803 B2 | 11/2021 | Mizuno et al. |
| 2007/0103660 A1 | 5/2007 | Tanaka |
| 2015/0008768 A1* | 1/2015 | Achterberg ............ B65G 54/02 310/12.11 |
| 2015/0142182 A1 | 5/2015 | Kimura et al. |
| 2016/0325761 A1* | 11/2016 | Pruessmeier ........ H02K 41/031 |
| 2016/0347550 A1* | 12/2016 | Paweletz ................ B65G 54/02 |
| 2017/0324304 A1 | 11/2017 | Ito |
| 2019/0100389 A1* | 4/2019 | Neubauer ................ H02K 7/08 |
| 2019/0367297 A1* | 12/2019 | Hartung ................ B65G 54/02 |
| 2020/0052568 A1 | 2/2020 | Yamamoto |
| 2021/0094764 A1 | 4/2021 | Umeyama et al. |
| 2021/0159769 A1 | 5/2021 | Yamamoto |
| 2021/0184555 A1 | 6/2021 | Ota |
| 2021/0242765 A1 | 8/2021 | Suzuki et al. |
| 2021/0249943 A1 | 8/2021 | Yamamoto |

FOREIGN PATENT DOCUMENTS

| | | |
|---|---|---|
| CN | 108702079 A | 10/2018 |
| CN | 108946032 A | 12/2018 |
| CN | 109080497 A | 12/2018 |
| CN | 110073589 A | 7/2019 |
| CN | 110829781 A | 2/2020 |
| CN | 111321375 A | 6/2020 |
| JP | S61-177103 A | 8/1986 |
| JP | H06-24559 A | 2/1994 |
| JP | H09-19004 A | 1/1997 |
| JP | 2936359 B2 | 8/1999 |
| JP | 2014-165993 A | 9/2014 |
| JP | 2020-96514 A | 6/2020 |

OTHER PUBLICATIONS

Chinese Office Action dated Aug. 28, 2024 during prosecution of related application No. 202111244233.2 (English-language machine translation included).

Chinese Office Action dated Dec. 23, 2024 during prosecution of related application No. 202111244233.2 (English-language machine translation included).

* cited by examiner

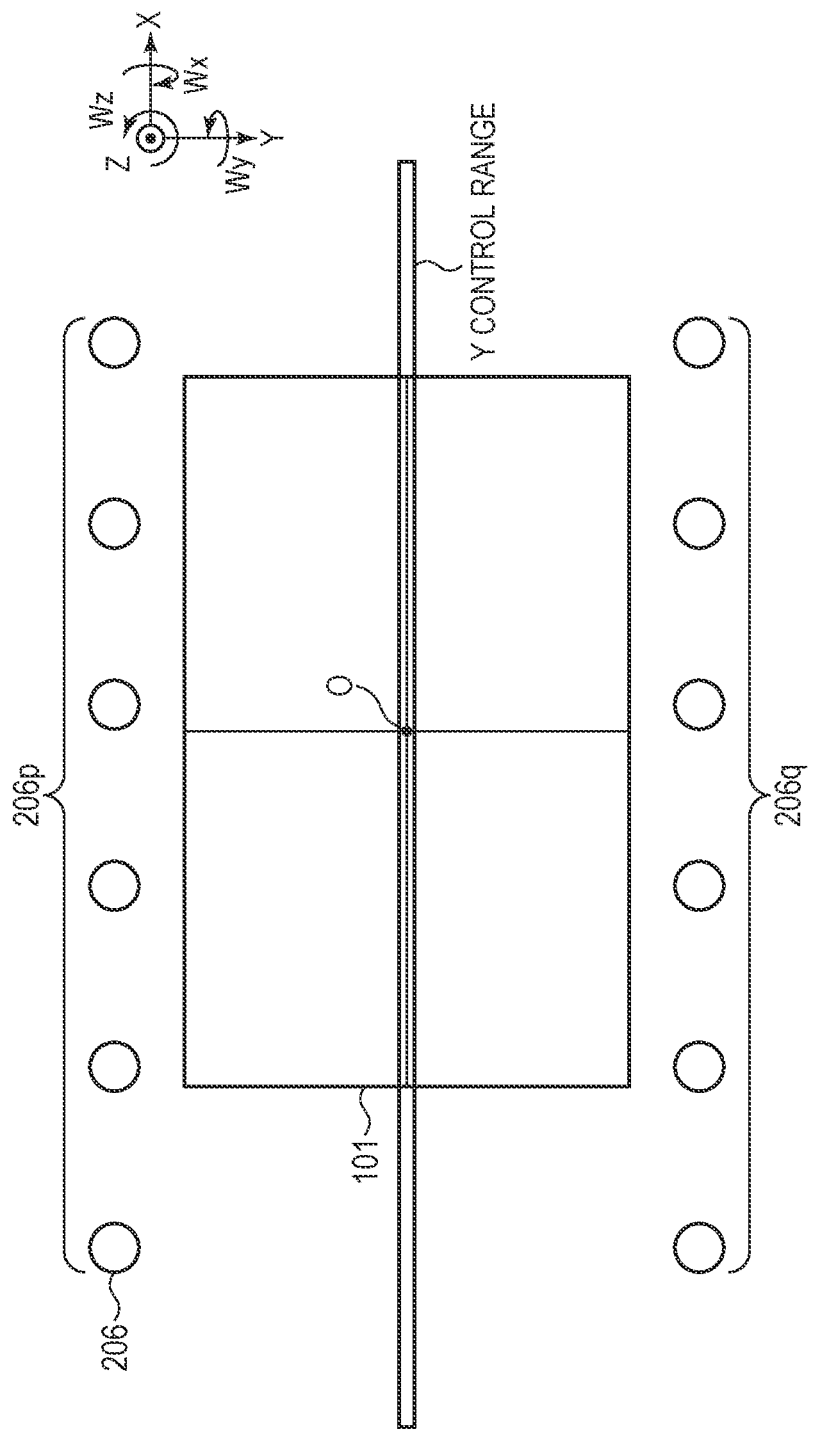

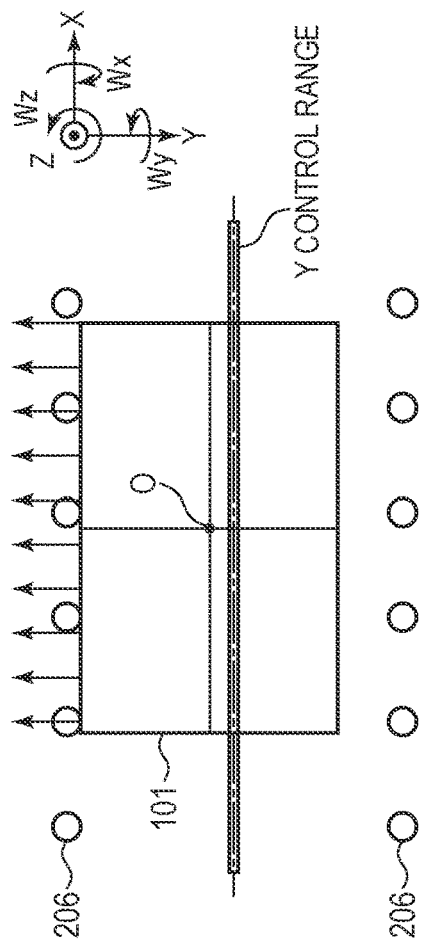
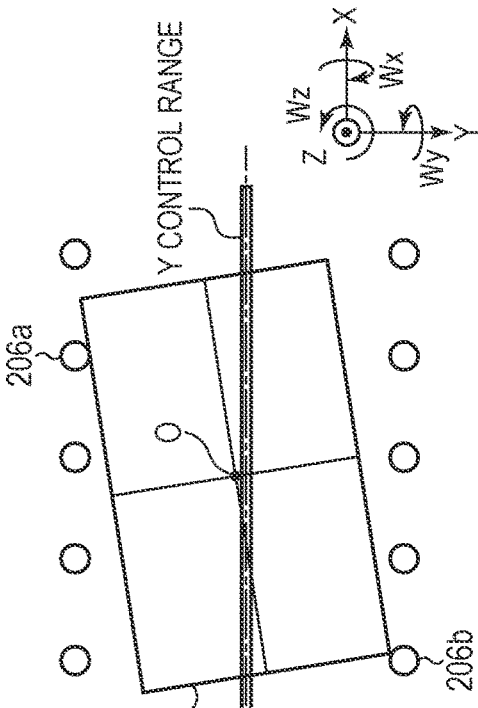
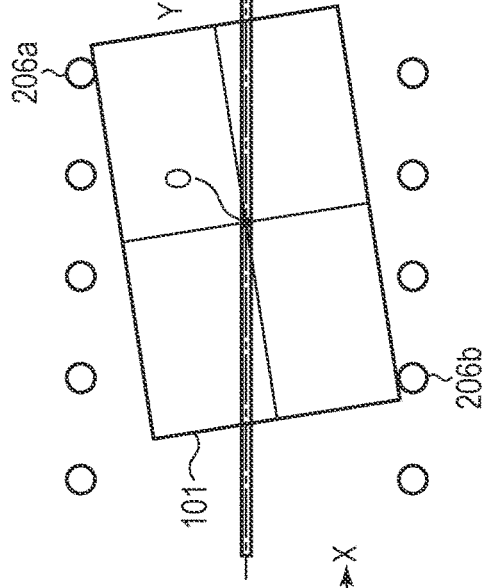

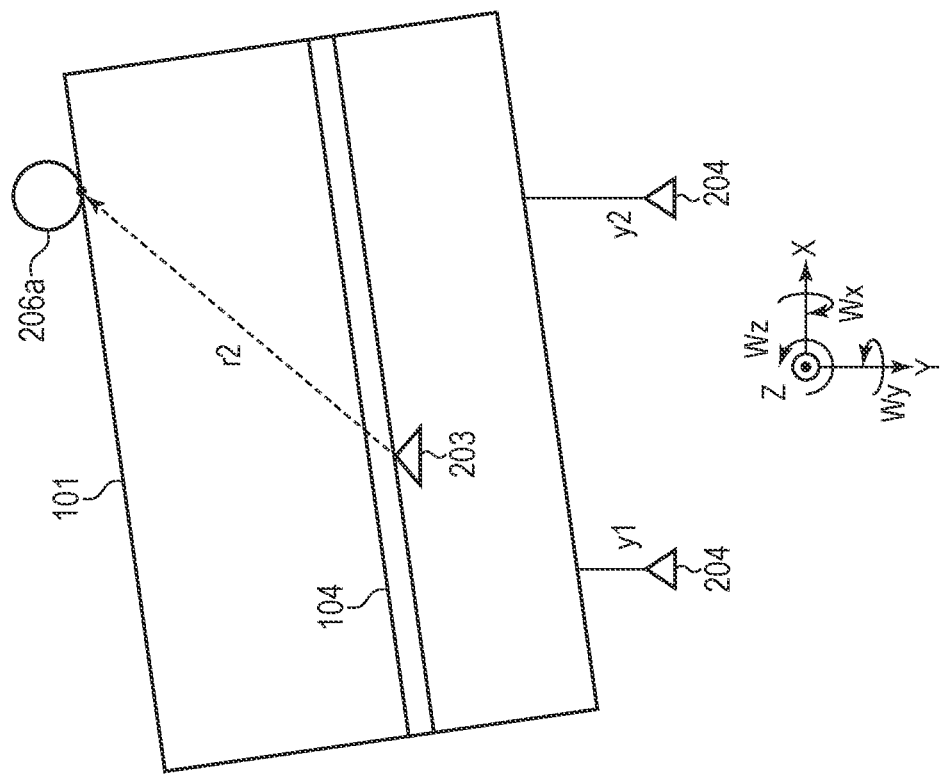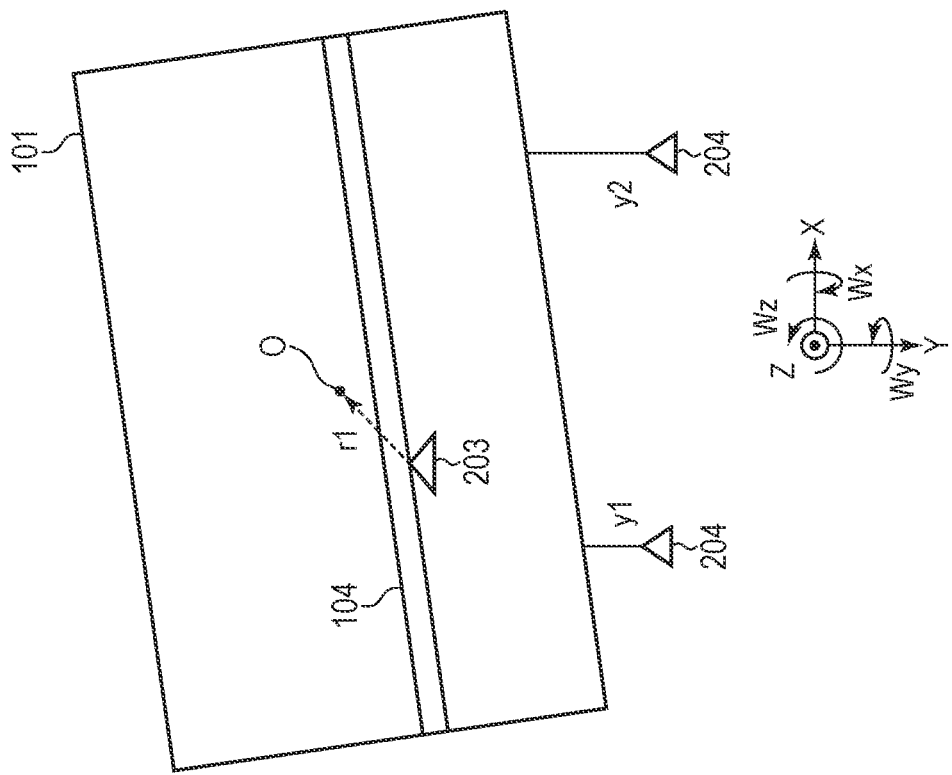

FIG. 10A
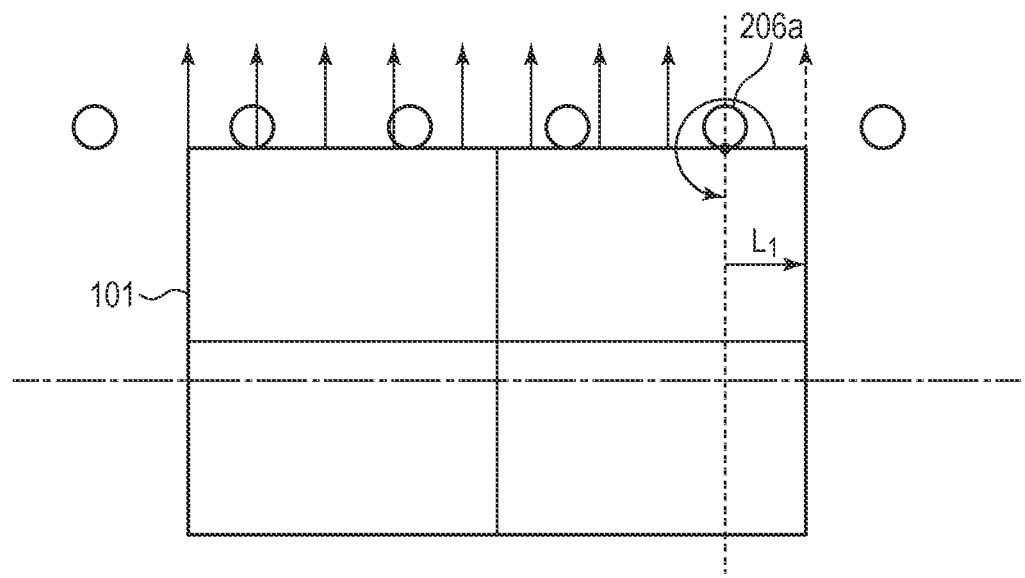
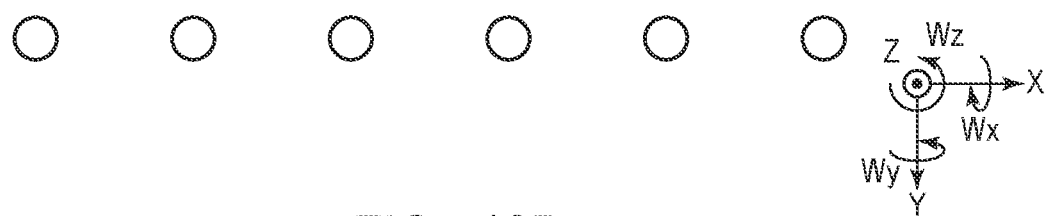
FIG. 10B
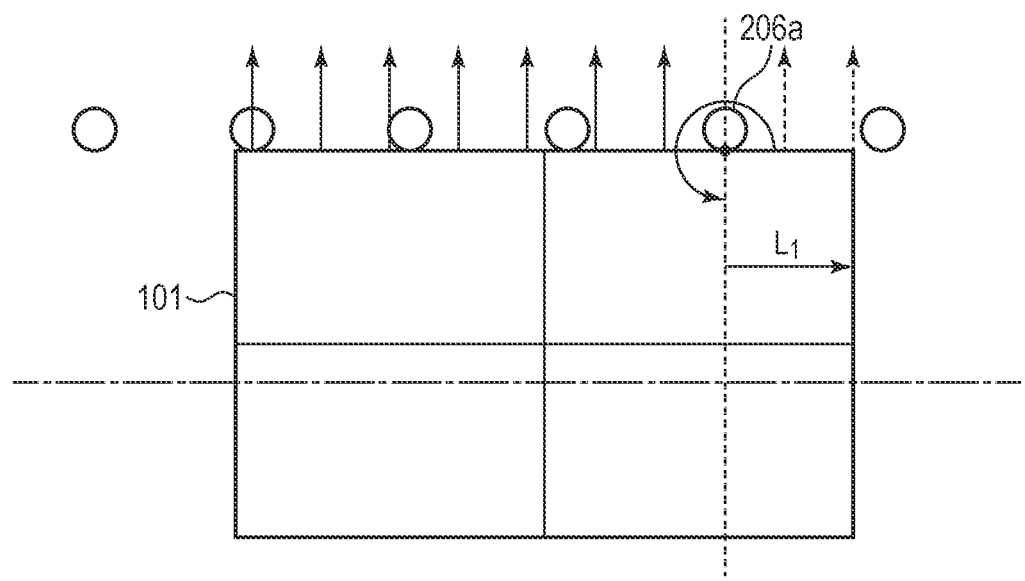
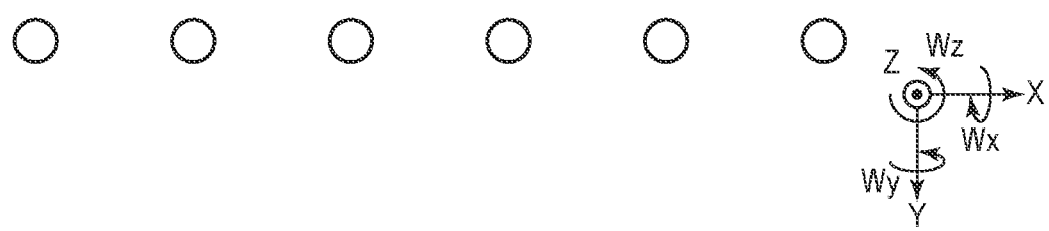

FIG. 16
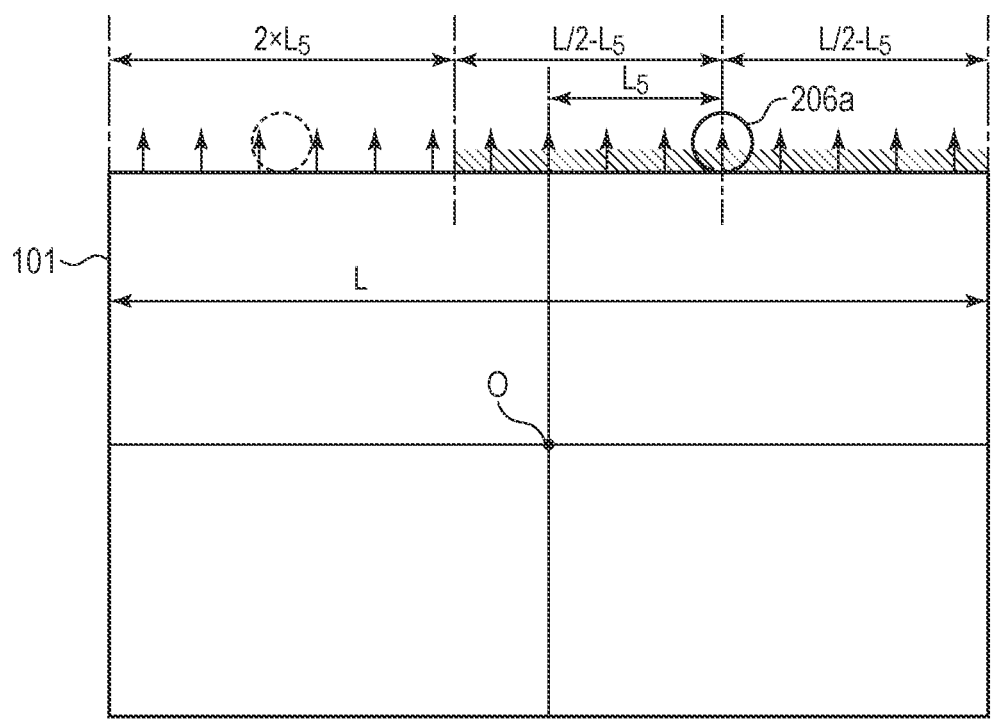
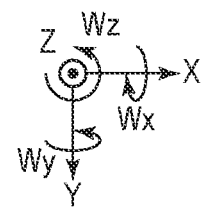

TRANSPORT SYSTEM AND CONTROL METHOD OF TRANSPORT SYSTEM

BACKGROUND OF THE INVENTION

Field of the Invention

The present invention relates to a transport system and a control method of the transport system.

Description of the Related Art

A non-contact type transport system controls the position and attitude of a mover while maintaining a floating state, and transports the mover by driving the mover in the transport direction. When an abnormality occurs in the control state of the mover due to an abnormality or the like of a sensor for detecting the position of the mover, the mover may be brought into contact with the transport path and stopped. When the transport is resumed after the cause of the abnormality is removed, a process of transition from the contact state to the floating state is performed. When transition from the contact state to the floating state, control is performed to float the mover by a method different from the transport state.

Japanese Patent Application Laid-Open No. H09-19004 discloses a suction-type magnetic levitation vehicle. In the Japanese Patent Application Laid-Open No. H09-19004, the instantaneous power at the start of floating or landing is reduced by transitioning the time of the start of floating or landing such that a plurality of dollies do not float or land simultaneously.

Japanese Patent Application Laid-Open No. H09-19004 discloses reducing instantaneous power of the entire transport system for controlling a plurality of dollies. However. In Japanese Patent Application Laid-Open No. H09-19004, regarding the return from landing condition to floating condition, a study focusing on individual dolly has not been made.

SUMMARY OF THE INVENTION

According to an aspect of the present invention, there is provided a transport system including: a stator having a first magnetic force unit; a mover having a second magnetic force unit; and a control unit. The control unit controls a magnetic force acting between the first magnetic force unit and the second magnetic force unit to transport the mover in a first direction. The stator has a first regulating member row including a plurality of first regulating members and a second regulating member row including a plurality of second regulating members, the mover, in a second direction intersecting the first direction, being disposed between the first regulating member row and the second regulating member row. The control unit performs a first process of applying a rotational force to the mover such that one of the first regulating members in the first regulating member row serves as a fulcrum when the mover contacts the first regulating member row.

According to another aspect of the present invention, there is provided a transport system including: a stator having a first magnetic force unit; a mover having a second magnetic force unit; and a control unit. The control unit controls a magnetic force acting between the first magnetic force unit and the second magnetic force unit to transport the mover in a first direction. The mover has two side surfaces in a second direction intersecting the first direction and has a plurality of first regulating members disposed on one side surface and a plurality of second regulating members disposed on the other side surface of the mover. The control unit performs a first process of applying a rotational force to the mover such that one of the first regulating members of the first regulating member row serves as a fulcrum when the first regulating member row of the mover contacts the stator.

According to another aspect of the present invention, there is provided a control method of a transport system including a stator having a first magnetic force unit; a mover having a second magnetic force unit; and a control unit. The control unit controls a magnetic force acting between the first magnetic force unit and the second magnetic force unit to transport the mover in a first direction. The stator has a first regulating member row including a plurality of first regulating members and a second regulating member row including a plurality of second regulating members, the mover, in a second direction intersecting the first direction, being disposed between the first regulating member row and the second regulating member row. The control method comprises: preforming a first process of applying a rotational force to the mover such that one of the first regulating members of the first regulating member row serves as a fulcrum when the mover contacts the first regulating member row.

Further features of the present invention will become apparent from the following description of exemplary embodiments with reference to the attached drawings.

BRIEF DESCRIPTION OF THE DRAWINGS

FIG. 4 is a schematic top view illustrating a state in which the mover and a stator are not in contact with each other according to the first embodiment.

FIGS. 5A, 5B, and 5C are schematic top views illustrating a state in which the mover and the stator are in contact with each other according to the first embodiment.

FIGS. 8A and 8B are schematic top views illustrating X direction control of the mover according to the first embodiment.

FIGS. 10A and 10B are schematic top views for explaining a first determination condition for determining whether or not a state in which the mover and the stator are in contact with each other can be transitioned to a state in which the mover and the stator are not in contact with each other according to the first embodiment.

FIG. 16 is a schematic top view for explaining the relationship between the positional relationship between the mover and the stator and the torque according to the second embodiment.

DESCRIPTION OF THE EMBODIMENTS

Figure 1:
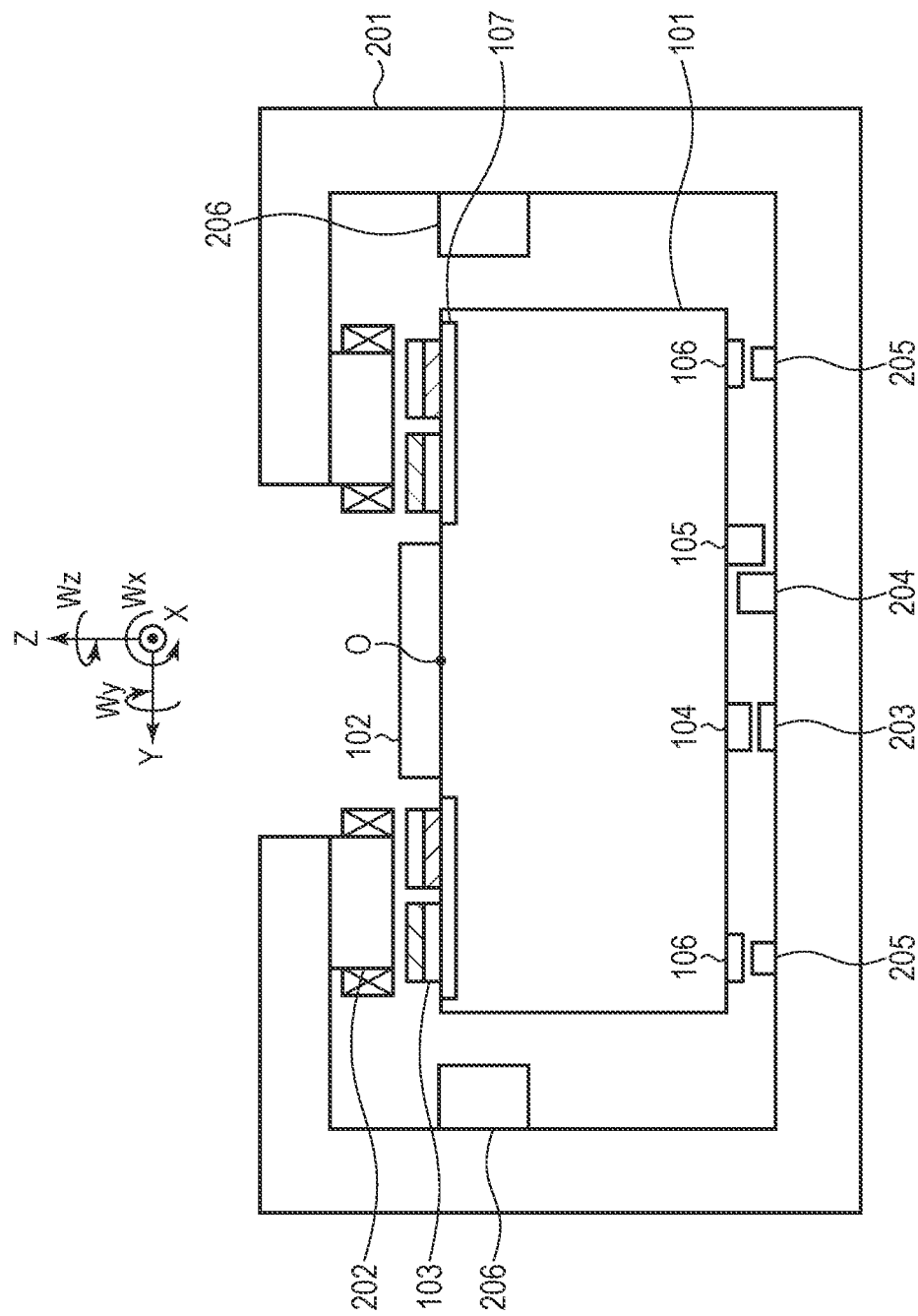
FIG. 1 is a schematic cross-sectional view illustrating an overall configuration of a transport system according to a first embodiment.

Hereinafter, embodiments of the present invention will be described with reference to the drawings. In the drawings, the same or corresponding elements are denoted by the same reference numerals, and the description thereof may be omitted or simplified. In addition, the same kind of constituent elements arranged at different positions may be distinguished by adding a lower case letter alphabet to the end of the same numeral as an identifier. In addition, when there is no need to be particularly distinguished and described, a sign of only a numeral may be used without attaching an identifier.

First Embodiment

Figure 2:
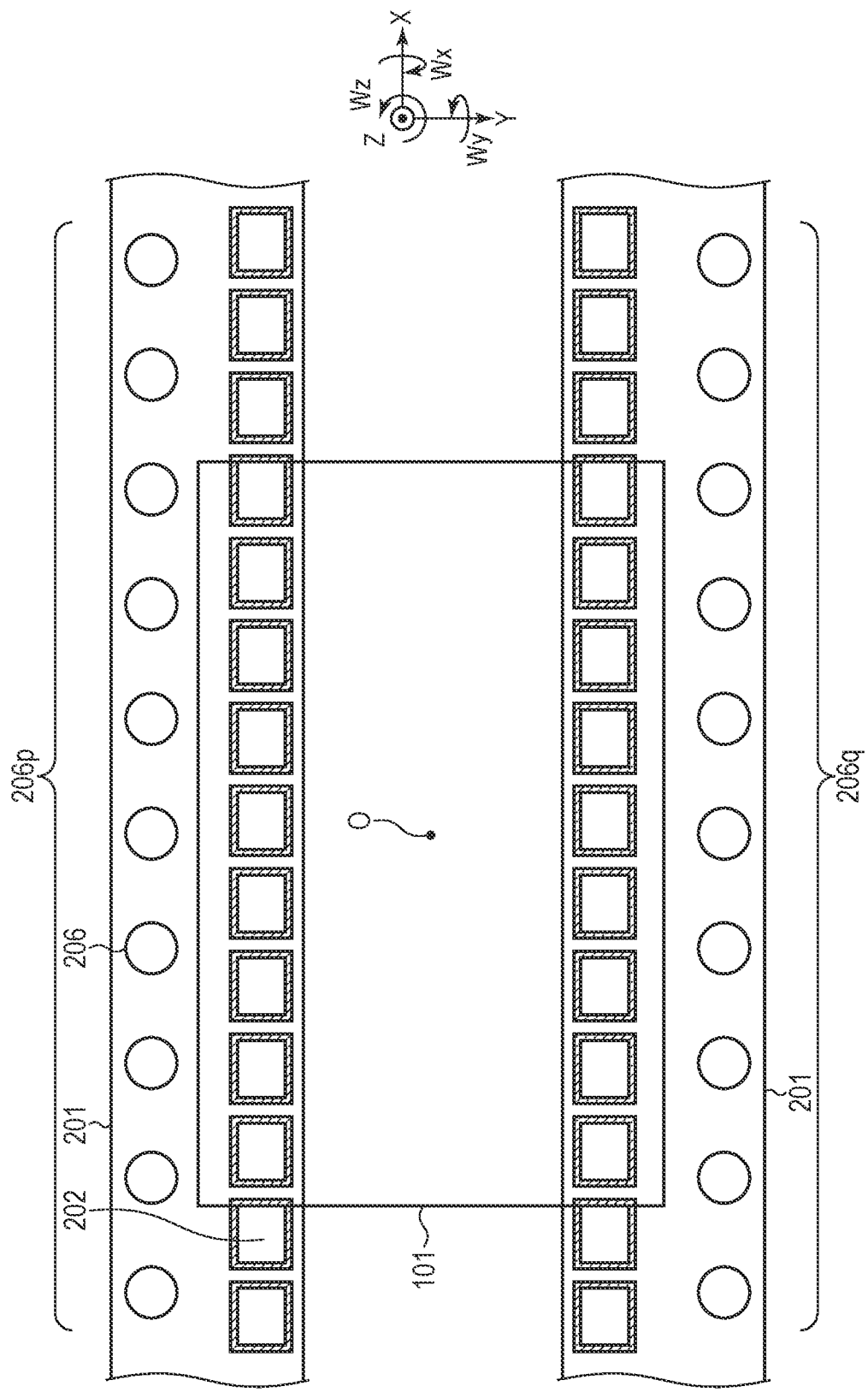
FIG. 2 is a schematic top view illustrating the overall configuration of the transport system according to the first embodiment.
Figure 3:
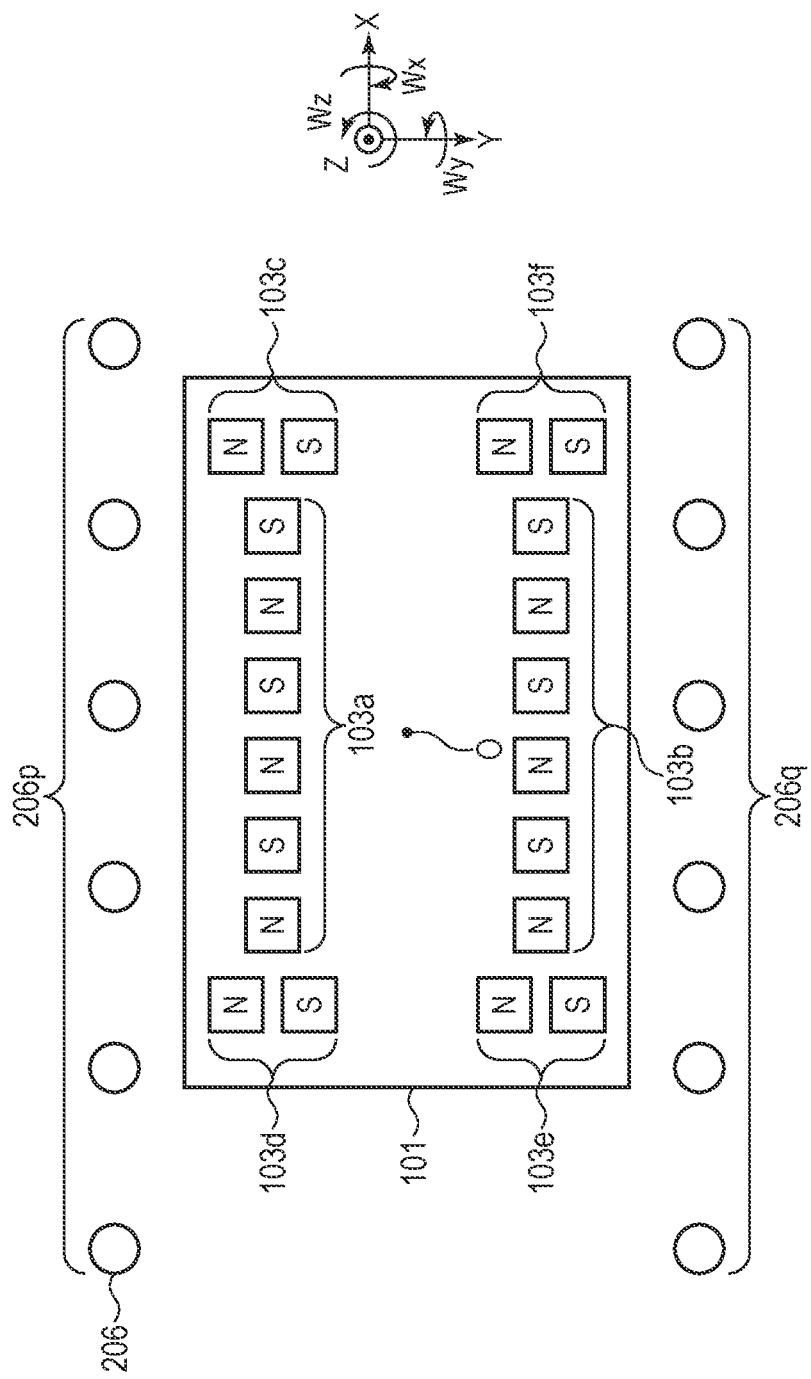
FIG. 3 is a schematic top view illustrating a magnet arrangement of a mover according to the first embodiment.

First, an overall configuration of a transport system according to the present embodiment will be described with reference to FIGS. 1, 2, and 3. FIG. 1 is a schematic cross-sectional view illustrating the overall configuration of a transport system according to the present embodiment. FIG. 2 is a schematic top view illustrating the overall configuration of the transport system according to the present embodiment. FIG. 3 is a schematic top view illustrating a magnet arrangement of the mover according to the present embodiment.

As illustrated in FIGS. 1 and 2, the transport system according to the present embodiment includes a mover 101 constituting a dolly, a slider, or a carriage, and a stator 201 constituting a transport path. The transport system according to the present embodiment is a movable magnet type linear motor (moving permanent magnet type linear motor, movable field type linear motor) in which permanent magnets are arranged in the mover 101 and coils are arranged in the stator 201. Further, the transport system according to the present embodiment is a magnetic levitation type transport system that does not have a guide device such as a linear guide and can transport the mover 101 on the stator 201 in a non-contact manner. The transport system of the present embodiment may be modified to a movable coil type linear motor in which a coil is disposed in the mover 101 and a permanent magnet is disposed in the stator 201.

The transport system according to the present embodiment may be a system that transports a workpiece 102 on the mover 101 to a processing apparatus or the like that performs a processing operation on the workpiece 102. The mover 101 may have a holding mechanism for holding the workpiece 102 such as a workpiece holder on the mover 101 by transporting the mover 101.

Here, coordinate axes, directions, and the like used in the following description will be defined with reference to FIGS. 1 and 2. First, an X-axis is taken along the horizontal direction which is the transport direction of the mover 101, and the transport direction of the mover 101, that is, the direction in which the transport path extends is defined as an X direction (first direction). Further, a Z-axis is taken along a vertical direction which is a direction orthogonal to the X direction, and a vertical direction is taken as a Z direction. A Y-axis is taken along a direction orthogonal to the X direction and the Z direction, and a direction orthogonal to the X direction and the Z direction is taken as a Y direction (second direction). Further, rotation about the X-axis is taken as Wx, rotation about the Y-axis is taken as Wy, and rotation about the Z-axis is taken as Wz. The center of the mover 101 is taken as a center O. The transport direction of the mover 101 is not necessarily the horizontal direction, but in this case, the transport direction may be the X direction, and the Y direction and the Z direction intersecting the X direction may be similarly determined. Hereinafter, the control of performing parallel movement in each direction of X, Y, and Z or rotation of Wx, Wy, and Wz around respective axes with reference to the center O of the mover 101 will be described as six-axis control.

Next, the mover 101 to be transported in the transport system according to the present embodiment will be described with reference to FIGS. 1 and 3. FIG. 1 is a schematic view illustrating the mover 101 and the stator 201 in the transport system according to the present embodiment. FIG. 1 is a view of the mover 101 and the stator 201 viewed from the X direction.

As illustrated in FIGS. 1 and 3, the mover 101 is mounted such that a permanent magnet group 103 (second magnetic force unit), which is a magnet group consisting of a plurality of magnets, forms two rows on the upper surface of the mover 101 at intervals in the Y direction along the X direction. The permanent magnet group 103 includes a plurality of permanent magnets 103a, 103b, 103c, 103d, 103e, and 103f. The plurality of permanent magnets 103a and 103b for X direction and Z direction control are arranged side by side in the X direction such that the polarities of the magnetic poles are alternately arranged. The plurality of permanent magnets 103c, 103d, 103e, and 103f for Y direction control are arranged side by side in the Y direction such that the polarities of the magnetic poles are alternately arranged.

Each of permanent magnets constituting the permanent magnet group 103 is attached to a yoke 107 provided on the upper surface of the mover 101. The yoke 107 is made of a material having a high magnetic permeability such as iron. In the example of FIG. 3, the permanent magnets 103c, 103d, 103e, and 103f for Y direction control are disposed at positive and negative sides of the mover 101 in the Y direction, but the present invention is not limited thereto. The number and arrangement of the permanent magnets can be appropriately changed in accordance with the required specifications of the transport system.

The mover 101 transported on the stator 201 has a linear scale 104, a Y target 105, and a plurality of Z targets 106. Each of the linear scale 104, the Y target 105, and the Z target 106 is attached to, for example, the bottom of the mover 101 along the X direction. The Z targets 106 are attached to both sides of the linear scale 104 and the Y target 105, respectively.

The stator 201 includes a plurality of coils 202 (first magnetic force units), a plurality of linear encoders 203, a plurality of Y sensors 204, and a plurality of Z sensors 205. As illustrated in FIG. 2, the plurality of coils 202 are attached along the X direction in which the mover 101 is transported. The plurality of coils 202 are arranged at predetermined intervals in the X direction. Each of the coils 202 is attached such that its central axis is oriented in the Y direction. The coil 202 may be a coil with a core or a coreless coil.

The current of the plurality of coils 202 is controlled, for example, in units of three coils. When the coil 202 is energized, the coil 202 generates a magnetic force with the permanent magnet group 103 of the mover 101 to apply a force to the mover 101.

Each of the coils 202 is arranged such that the center of the two permanent magnets 103c in the Y direction coincide with the center of the coil 202 in the Y direction. The same applies to the permanent magnets 103d, 103e, and 103f. When the coils 202 opposed to the permanent magnet 103c, 103d, 103e, and 103f is energized, each of the permanent magnet 103c, 103d. 103e, and 103f receives a force in the Y direction.

The coils 202 face the permanent magnets 103a and 103b. When the coils 202 are energized, the permanent magnets 103a and 103b receive forces in the X direction and the Z direction.

The plurality of linear encoders 203 are attached to the stator 201 along the X direction so as to be able to face the linear scale 104 of the mover 101. Each of linear encoders 203 can detect and output a relative position of the mover 101 with respect to the linear encoder 203 by reading the linear scale 104 attached to the mover 101.

The plurality of Y sensors 204 are attached to the stator 201 along the X direction so as to be able to face the Y target 105 of the mover 101, respectively. Each of Y sensors 204 can detect and output a relative distance in the Y direction between the Y sensor 204 and the Y target 105 attached to the mover 101.

The plurality of Z sensors 205 are attached to the stator 201 in two rows along the X direction so as to be able to face the Z target 106 of the mover 101. Each of Z sensors 205 can detect and output a relative distance in the Z direction between the Z sensor 205 and the Z target 106 attached to the mover 101.

The Y roller 206 is a regulating member for regulating the stroke of the mover 101 in the Y direction, and is disposed on the stator 201. A plurality of Y rollers 206 are arranged along the X direction, which is the transporting direction, to form a Y roller group. In order to regulate the positive side stroke and the negative side stroke in the Y direction, the Y roller group is arranged on the positive side and the negative side in the Y direction such that Y roller groups 206p and 206q (first regulating member row and second regulating member row) in two rows are formed. Similarly, in order to regulate the positive stroke and the negative stroke in the Z direction, Z roller groups (not illustrated) may be arranged in two rows. Each of the above-mentioned rollers has a role of limiting the stroke in the Y direction and the Z direction, and has a role of enabling transport in a contact state when the mover 101 contacts these rollers. Instead of the Y roller 206, a regulating member such as a stopper having no rotation mechanism may be used.

The transport system has an integrated controller (not illustrated). The integrated controller is a control unit of the transport system. The integrated controller detects the positional relationship between the stator 201 and the mover 101, grasps the positional relationship between the coil 202 and the permanent magnet group 103, and causes an appropriate current to flow through the coil 202, thereby realizing six-axis control at the center O.

Next, the two states in this embodiment, a state in which the mover 101 can be transported without contacting the stator 201, and a state in which the mover 101 is stopped by contacting the stator 201, are explained by using FIGS. 4, 5A, 5B, and 5C. FIG. 4 is a schematic top view illustrating a state in which the mover 101 and the stator 201 are not in contact with each other. The roller groups in the two rows consisting the plurality of Y rollers 206 are arranged at a position where the stroke in the Y direction is wider than the range in which the mover 101 can be controlled to move in the Y direction by the permanent magnets 103c to 103f for Y direction control and the coil 202. Hereinafter, a range in which the center O determined by the interval between the Y roller groups 206p and 206q in the two rows and the width of the mover 101 in the Y direction can move is referred to as a Y stroke. The controllable range of the mover 101 in the Y direction is referred to as a Y control range. It is assumed that the mover 101 can be controlled in the Y direction when the center O of the mover 101 is within the Y control range.

The wider the Y control range, the more suitable the mover 101 can be controlled. However, there is a limit to the width of the Y control range in design for the following reason. In order to widen the Y control range, it is necessary to increase the size of the coil 202 so as to increase the thrust that can be generated in the Y direction. This causes a factor that increases the size and cost of the apparatus. Further, the thrust in the Y direction required during normal workpiece transport is smaller than the thrust required to transition from a state in which the mover 101 is in contact with the Y roller to a state in which transport of the mover 101 can be performed in a non-contact manner. Therefore, even if the size of the coil 202 is increased along with an increase in size of the apparatus and an increase in cost, it does not contribute to an improvement in transport performance during normal transport of the transport system. Considering such a design aspect, it may not be possible to design the Y control range to be sufficiently wide.

On the other hand, the Y stroke is designed to be large to some extent from the following aspect. When the dimension error of the mover 101 or the transport accuracy of the mover 101 is larger than that of the Y stroke, the Y roller 206 and the mover 101 may come into contact with each other during transport. In this case, the non-contact transport cannot be realized, and the transport accuracy may be further degraded. To reduce the possibility of such contact, the Y stroke is designed to be somewhat wide.

For the above reasons, the transport system according to the present embodiment applies a configuration in which the Y stroke is sufficiently large with respect to the Y control range. Therefore, when the mover 101 is separated from the center of the transport path to some extent, the center O of the mover 101 may be out of the Y control range. The transport system of the present embodiment has a function of return process when the mover 101 stops in contact with the Y roller group in a state in which the center O of the mover 101 is out of the Y control range. Hereinafter, the return process will be described.

FIGS. 5A, 5B, and 5C are schematic top views illustrating a state in which the mover 101 and the stator 201 are in contact with each other. FIGS. 5A, 5B, and 5C illustrate the positional relationship between the mover 101 in a stopped state and the Y roller 206.

As described above, during normal transport, the position of the mover 101 is controlled such that the mover 101 is not in contact with the stator 201 and the center O is within the Y control range. However, in a situation in which the transport of the mover 101 is controlled to be stopped, or in a situation in which the six-axis control is stopped due to abnormality of the control system or the like, the mover 101 is in contact with the Y roller group in any one of the modes illustrated in FIGS. 5A, 5B, and 5C. In FIG. 5A, the mover 101 is in contact with the Y roller 206 disposed on the negative side in the Y direction, but may be stopped by contacting with the Y roller 206 disposed on the positive side in the Y direction.

The mover 101 stops in any one of the modes illustrated in FIGS. 5A, 5B, and 5C depending on such as a direction of the force applied to the mover 101 immediately before the stop. FIG. 5A is a diagram illustrating the positional relationship between the mover 101 and the Y roller 206 when the mover 101 stops in contact with the Y roller group of one row on one side. FIG. 5B is a diagram illustrating a positional relationship between the mover 101 and the Y roller 206 when the mover 101 is stopped in a state in which the mover 101 is stuck between two Y roller groups and the center O is within the Y control range. FIG. 5C is a diagram illustrating a positional relationship between the mover 101 and the Y roller 206 when the mover 101 is stopped in a state in which the mover 101 is stuck between two Y roller groups and the center O is outside the Y control range, as in FIG. 5B. In FIGS. 5B and 5C, it is assumed that the mover 101 is in contact with the Y roller 206a in the negative row and the Y roller 206b in the positive row. Hereinafter, states in which the mover 101 stops in the modes of FIGS. 5A, 5B, and 5C may be referred to as a contact pattern (a), a contact pattern (b), and a contact pattern (c), respectively.

The reason why these stopped states occur is that, in the transport system according to the present embodiment, the mover 101 which is stopped receives the magnetic attraction force in the Y direction due to the magnetic force between the plurality of coils 202 and the permanent magnet group 103. The arrows in FIG. 5A schematically indicate the magnetic attraction force received by the mover 101 in the Y direction. As described above, in the transport system of the present embodiment, the Y stroke is sufficiently large with respect to the Y control range. Therefore, in the state of the contact pattern (a), the center O is outside the Y control range. In order to transition from a state in which the mover 101 is in contact with the Y roller 206 and stopped to a state in which the mover 101 can be transported in a non-contact manner, it is necessary to separate the mover 101 from the Y roller 206 by applying a force greater than the magnetic attraction force to the mover 101.

Figure 6:
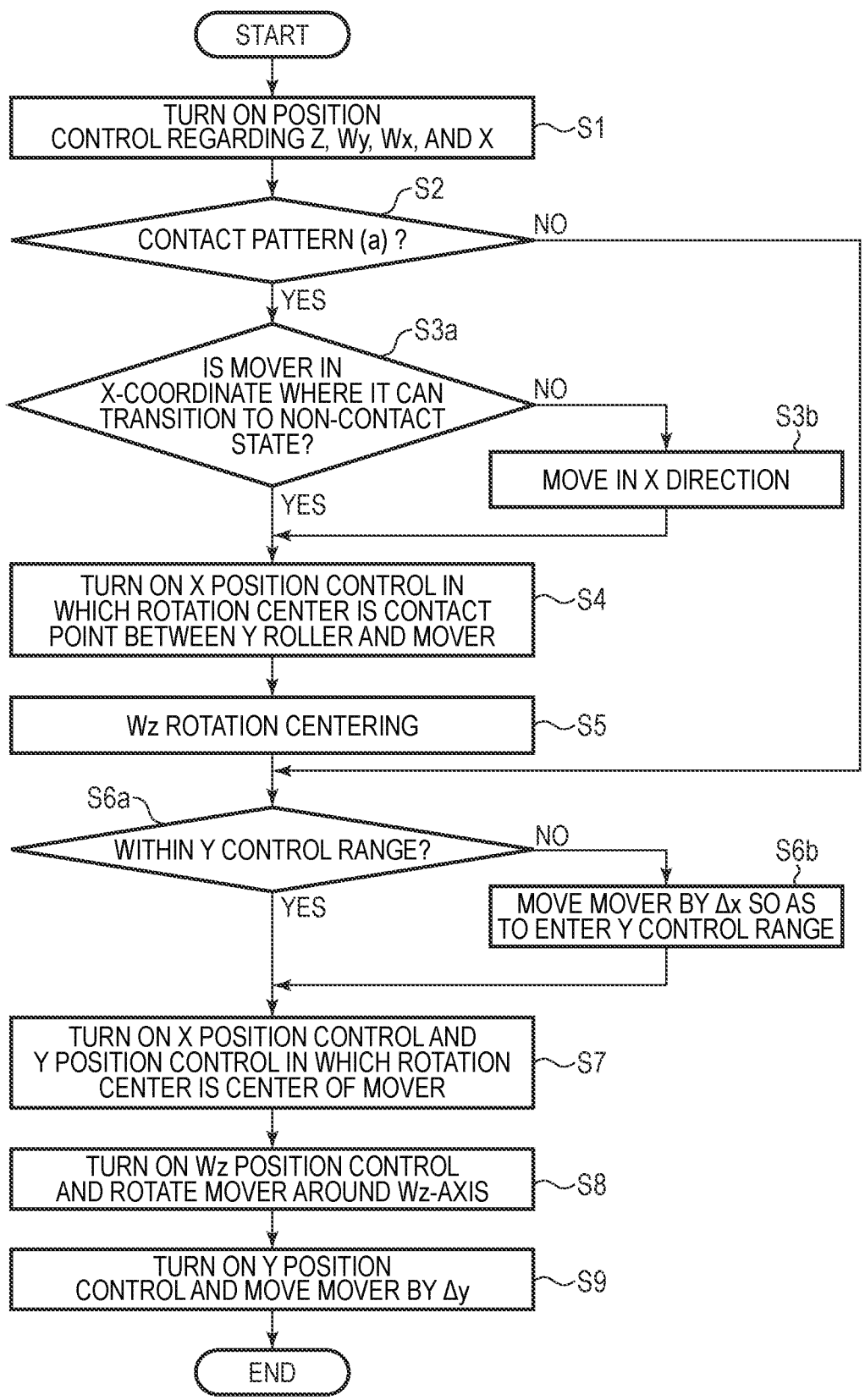
FIG. 6 is a flowchart illustrating an operation sequence for transitioning from a state in which the mover and the stator are in contact with each other to a state in which the mover and the stator are not in contact with each other according to the first embodiment.

An example of an operation sequence from the state illustrated in FIGS. 5A, 5B, and 5C to a state in which the mover 101 can be transported in a non-contact manner will be mainly described with reference to FIG. 6. FIG. 6 is a flowchart illustrating an operation sequence of a return process for transitioning a state in which the mover 101 and the stator 201 are in contact with each other to a state in which the mover 101 and the stator 201 are not in contact with each other.

Figure 9:
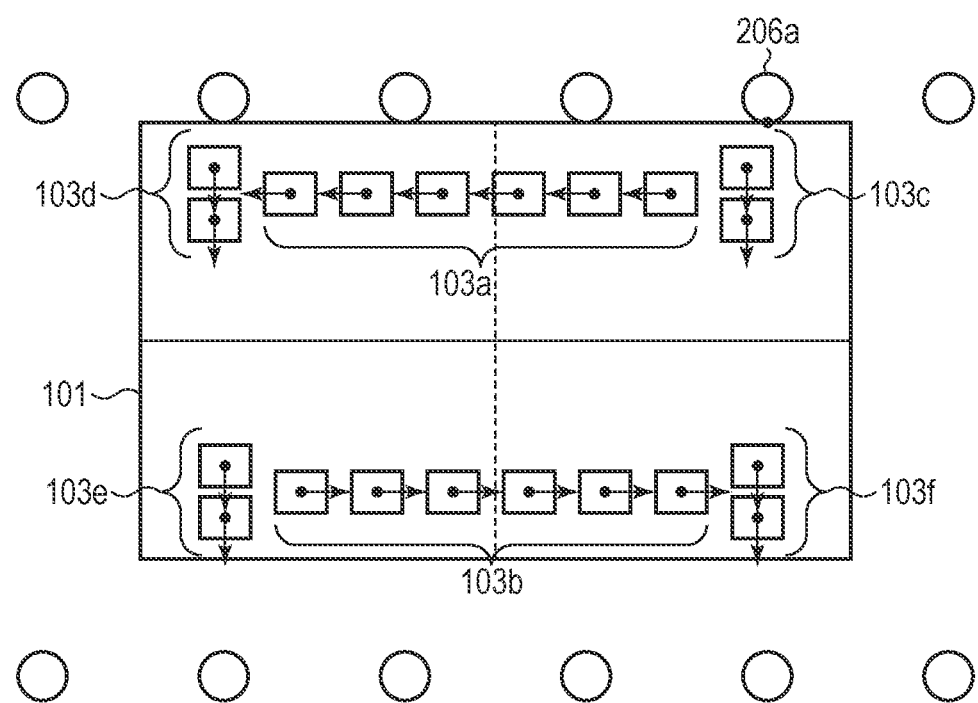
FIG. 9 is a schematic top view illustrating the direction of thrust applied to the permanent magnet during Wz rotation centering according to the first embodiment.

In the following description of FIG. 6, FIGS. 7A, 7B, 7C, 7D, 8A, 8B, 9, 10A, 10B, 11A, and 11B may be referred to as appropriate. FIGS. 7A to 7D are schematic top views illustrating an operation of transitioning from a state in which the mover 101 and the stator 201 are in contact with each other to a state in which the mover 101 and the stator 201 are not in contact with each other. FIGS. 8A and 8B are schematic top views illustrating X direction control of the mover 101. FIG. 9 is a schematic top view illustrating the direction of thrust received by the permanent magnet during rotation centering. FIGS. 10A, 10B, 11A, and 11B are schematic top views for explaining a condition in which the mover 101 and the stator 201 can transition from a contact state to a non-contact state.

In step S1, the integrated controller of the transport system activates (turns on) the position control for the four axes Z, Wy, Wx, and X of the six axes. In step S2, the integrated controller determines a contact pattern. When the state of the mover 101 is the contact pattern (a) (YES in step S2), the process proceeds to step S3a. When the state of the mover 101 is the contact pattern (b) or the contact pattern (c) (NO in step S2), the process proceeds to step S6a.

In step S3a, the integrated controller controls the linear encoder 203 to acquire a position (X-coordinate) of the mover 101 in the X direction and determines whether or not the mover 101 is located at a position in the X direction where the mover 101 can transition to the non-contact state. A specific example of a method of determining whether or not transition to the non-contact state is possible will be described later.

If it is determined in step S3a that the mover 101 is located at a position in the X direction where the mover 101 can transition to the non-contact state (YES in step S3a), the process proceeds to step S4. When it is determined that the mover 101 is located at a position in the X direction where the mover 101 cannot transition to the non-contact state (NO in step S3a), the process proceeds to step S3b.

Figure 7A:
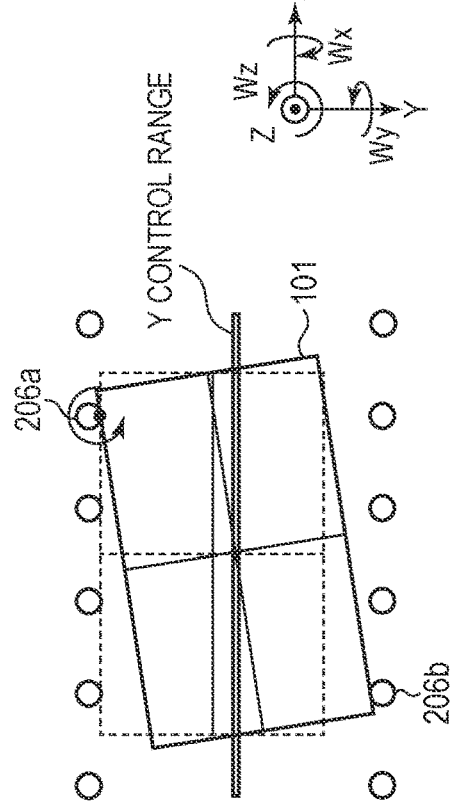
FIGS. 7A, 7B, 7C, and 7D are schematic top views illustrating an operation of transitioning from a state in which the mover and the stator are in contact with each other to a state in which the mover and the stator are not in contact with each other according to the first embodiment.

In step S3b, the integrated controller controls the mover 101 so as to move to a position in the X direction in which the mover 101 can transition to the non-contact state while maintaining the mover 101 in contact with the Y roller group. FIG. 7A is a schematic top view illustrating an operation of moving the mover 101 to the X-coordinate where it can transition to the non-contact state in step S3b. In FIG. 7A, the broken line indicates the mover 101 before the X direction movement, and the solid line indicates the mover 101 after the X direction movement. After the X direction movement is completed, the process proceeds to step S4. By performing the processes of steps S3a and S3b (second process), the mover 101 can be moved to a position suitable for the process of step S5 (Wz rotation centering) described later.

In step S4, the integrated controller switches the reference of the position control in the X direction from the center O of the mover 101 to the contact point between the mover 101 and the Y roller 206a located closest to the positive side in the X direction among the Y rollers in contact with the mover 101. Thus, the integrated controller can control the mover 101 to rotate about the contact point as a fulcrum between the Y roller 206a and the mover 101. The switching of the control will be described with reference to FIGS. 8A and 8B.

FIG. 8A is a diagram for explaining position control in the X direction in a state of six-axis control. The linear scale 104 and the linear encoder 203 are arranged at positions offset from the center O. The integrated controller calculates the position of the center O based on the count value X scale of the linear encoder 203 and the angle Wz of the mover 101 calculated from the distances y1 and y2 detected by the Y sensor 204, and performs feedback control. The following formula (1) can be used for this feedback control.

$$Xfb = Xscale - r1 \sin Wz \quad (1)$$

Here, Xfb is a feedback value of X direction control, that is, a position of the center O, and r1 is a distance from the linear encoder 203 to the center O.

FIG. 8B is a diagram for explaining position control in the X direction with reference to a contact point between the Y roller 206a and the mover 101. When the reference of the X direction position control is changed to the contact point between the Y roller 206a and the mover 101, the following formula (2) can be used for feedback control. In formula (2), r1 in formula (1) is replaced by r2 corresponding to the distance from the linear encoder 203 to the contact point.

$$Xfb = Xscale - r2 \sin Wz \quad (2)$$

Figure 7B:
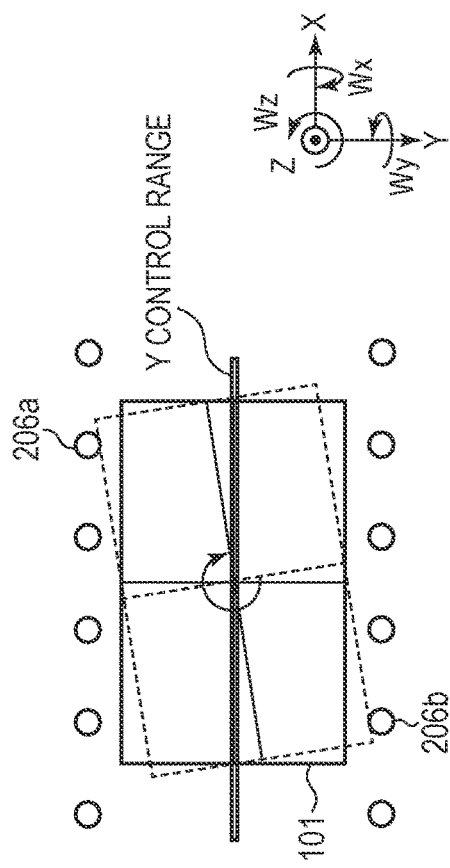

In step S5, the integrated controller performs a process (first process) of rotating the mover 101 in the positive direction of the Wz-axis and abutting the mover 101 against one Y roller 206b of the Y roller group opposed to the Y direction. Hereinafter, this operation is sometimes referred to as Wz rotation centering. FIG. 7B is a schematic top view illustrating the operation of the Wz rotation centering in step S5. In FIG. 7B, the broken line indicates the position of the mover 101 immediately before the Wz rotation centering, and the solid line indicates a state in which the mover 101 abuts against the Y roller 206b immediately after the Wz rotation centering.

Here, the direction of thrust generated in the permanent magnet group 103 during the Wz rotation centering in step S5 will be described with reference to FIG. 9. FIG. 9 is a schematic top view illustrating the direction of thrust applied to the permanent magnet during Wz rotation centering. By applying an appropriate current to the coil 202, the integrated controller causes the permanent magnet 103a for X direction control to generate a thrust in the X-axis negative direction and causes the permanent magnet 103b for X direction control to generate a thrust in the X-axis positive direction. In addition, the integrated controller causes the permanent magnet 103c, 103d, 103e, and 103f for Y direction control to generate a thrust in the Y-axis positive direction by applying an appropriate current to the coil 202. Thus, the integrated controller generates torque for Wz rotation centering by generating thrust in different directions between the plurality of sets of permanent magnets and the coils. The direction of thrust to be generated in each of the permanent magnets depends on the position of the contact point between the Y roller 206a serving as a fulcrum and the mover 101. Therefore, the integrated controller appropriately sets the current to be supplied to the coil 202 in accordance with the stop position of the mover 101 in the X direction.

Although FIG. 9 illustrates only the thrust required for obtaining the torque required for the Wz rotation centering, actually, the thrust required for the X direction control expressed by the above-described formula (2) may be added. However, in the Wz rotation centering, if the positional relationship between the contact points of the mover 101 and the Y roller 206a does not significantly change, the switching of the position control in the X direction from the above-described formula (1) to formula (2) may not be performed.

As illustrated in FIGS. 5B and 5C, when the state of the mover 101 is the contact pattern (b) or the contact pattern (c), the processes of steps S3a, S3b, S4, and S5 are omitted. This is because, in the contact pattern (b) and the contact pattern (c), the mover 101 is stopped in a state close to the completion of the Wz rotation centering operation in step S5.

In step S6a, the integrated controller determines whether or not the center O of the mover 101 is within the Y control range. When it is determined that the center O of the mover 101 is within the Y control range (YES in step S6a), the process proceeds to step S7. When it is determined that the center O of the mover 101 is outside the Y control range (NO in step S6a), the process proceeds to step S6b.

Figure 7C:
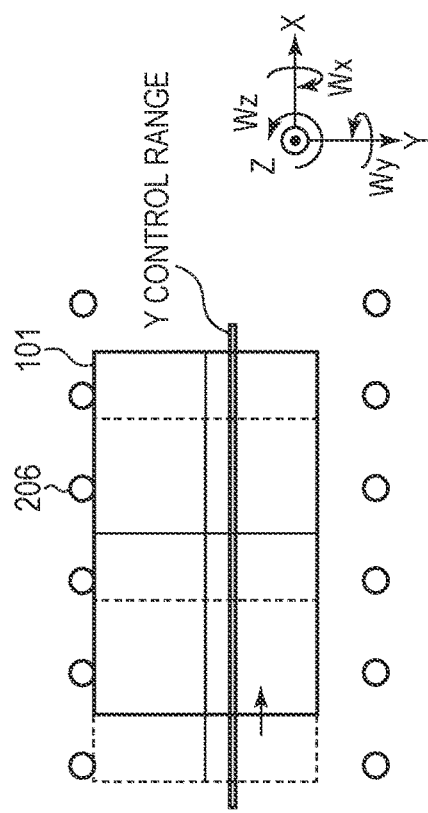

In step S6b, the integrated controller moves the mover 101 by a minute amount Δx in the X direction such that the center O of the mover 101 enters the Y control range. As described above, the position of the mover 101 in the X direction is controlled in steps S3a and S3b such that the center O enters the Y control range after the Wz rotation centering. However, the center O may not enter the Y control range after Wz rotation centering due to factors such as slippage between the Y roller 206a and the mover 101. In the process of step S6b, by moving the mover 101 in the X direction in such a case, the position of the mover 101 can be adjusted such that the center O of the mover 101 enters the Y control range. FIG. 7C is a schematic top view illustrating an operation of moving the mover 101 by a minute amount Δx in the X direction in step S6b. In FIG. 7C, the broken line indicates the mover 101 before the X direction movement, and the solid line indicates the mover 101 after the X direction movement. After the X direction movement is completed, the process proceeds to step S7. By performing the above-described processes of steps S6a and S6b (third process), it is possible to perform adjustment so as to move the position of the mover 101 within the Y control range.

Figure 7D:
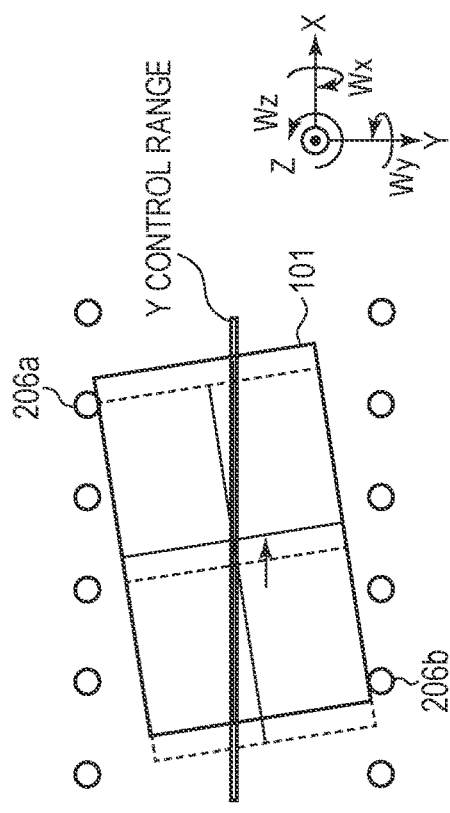

In step S7, the integrated controller switches to control in the X direction and the Y direction about the center O of the mover 101 as the rotation center. In step S8, the integrated controller enables control of the Wz-axis. Then, while maintaining the position of the center O, the integrated controller performs a process (fourth process) of returning the attitude of the mover 101 by rotating the mover 101 around the Wz-axis by applying a rotational force opposite to that in the Wz rotation centering. FIG. 7D is a schematic top view schematically illustrating an operation of rotating the mover 101 in step S8. In FIG. 7D, a broken line indicates the mover 101 before rotation, and a solid line indicates the mover 101 after rotation.

In step S9, the integrated controller enables control in the Y direction. Then, the mover 101 is moved in the Y direction by a minute amount Δy such that the center O of the mover 101 is aligned with the center axis of the Y control range. As described above, as in any one of FIGS. 5A, 5B, and 5C, the return process of transitioning from the state in which the mover 101 and the stator 201 are in contact with each other to the state in which the mover 101 and the stator 201 are not in contact with each other can be performed.

Next, in step S3a of FIG. 6, an example of a method of determining whether or not the mover 101 is located at a position in the X direction where the mover 101 can transition to the non-contact state will be described more specifically with reference to FIGS. 10A, 10B, 11A, and 11B. Whether or not the mover 101 can be transitioned to the non-contact state by the operation after step S4 of FIG. 6 can be determined by the following two determination conditions.

First, the first determination condition will be described with reference to FIGS. 10A and 10B. FIGS. 10A and 10B are schematic top views for explaining a first determination condition for determining whether or not the mover 101 and the stator 201 can transition from a contact state to a non-contact state. In FIGS. 10A and 10B, the mover 101 is in contact with the Y roller group by magnetic attraction force. FIG. 10A illustrates the positional relationship between the mover 101 and the Y roller 206a when the Wz torque required for the Wz rotation centering is large. FIG. 10B illustrates the positional relationship between the mover 101 and the Y roller 206a when the Wz torque required for the Wz rotation centering is small.

In FIGS. 10A and 10B, the Y roller 206a is a Y roller which serves as a fulcrum at the time of Wz rotation centering. In FIGS. 10A and 10B, arrows extending from the mover 101 indicate magnetic attraction forces in the Y direction acting per unit length of the mover 101. Here, a distance from a contact point between the Y roller 206a serving as a fulcrum and the mover 101 to an end portion of the mover 101 on the positive side in the X direction is defined as L1. The Wz torque required to perform the Wz rotation centering against the magnetic attraction force depends on the difference between the number of arrows on the X direction negative side and the number of arrows on the X direction positive side from the contact point. That is, as L1 is larger, the torque required to perform the Wz rotation centering is smaller.

Comparing FIGS. 10A and 10B, the Wz torque required to resist the magnetic attraction force is smaller in FIG. 10B because L1 in the state of FIG. 10B is larger than that in the state of FIG. 10A. In order to realize the Wz rotational centering, a Wz torque larger than the magnetic attraction force is required. Therefore, in step S3a, it is preferable to use whether or not L1 is larger than a predetermined threshold value as one of the determination conditions. The threshold value of this determination can be determined by the relationship between the Wz torque required to resist the magnetic attraction force determined in accordance with the position of L1 and the Wz torque that can be generated by the transport system.

Figure 11A:
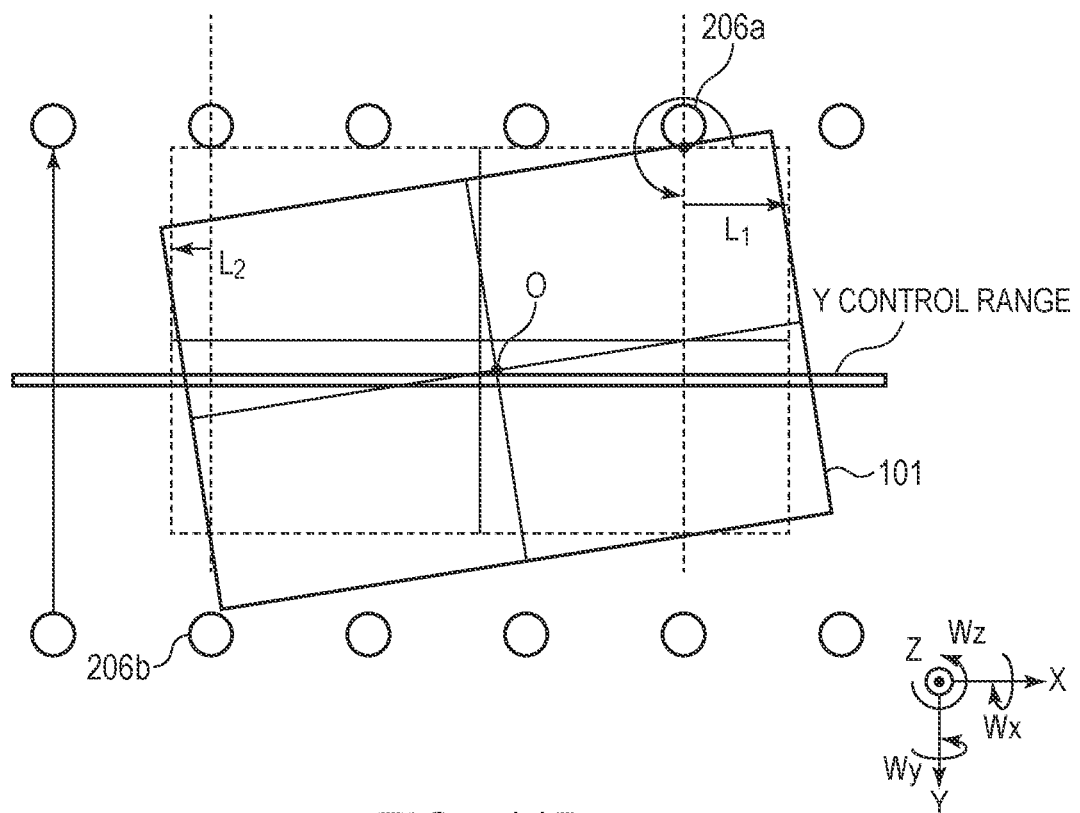
FIGS. 11A and 11B are schematic top views for explaining a second determination condition for determining whether or not a state in which the mover and the stator are in contact with each other can be transitioned to a state in which the mover and the stator are not in contact with each other according to the first embodiment.
Figure 11B:
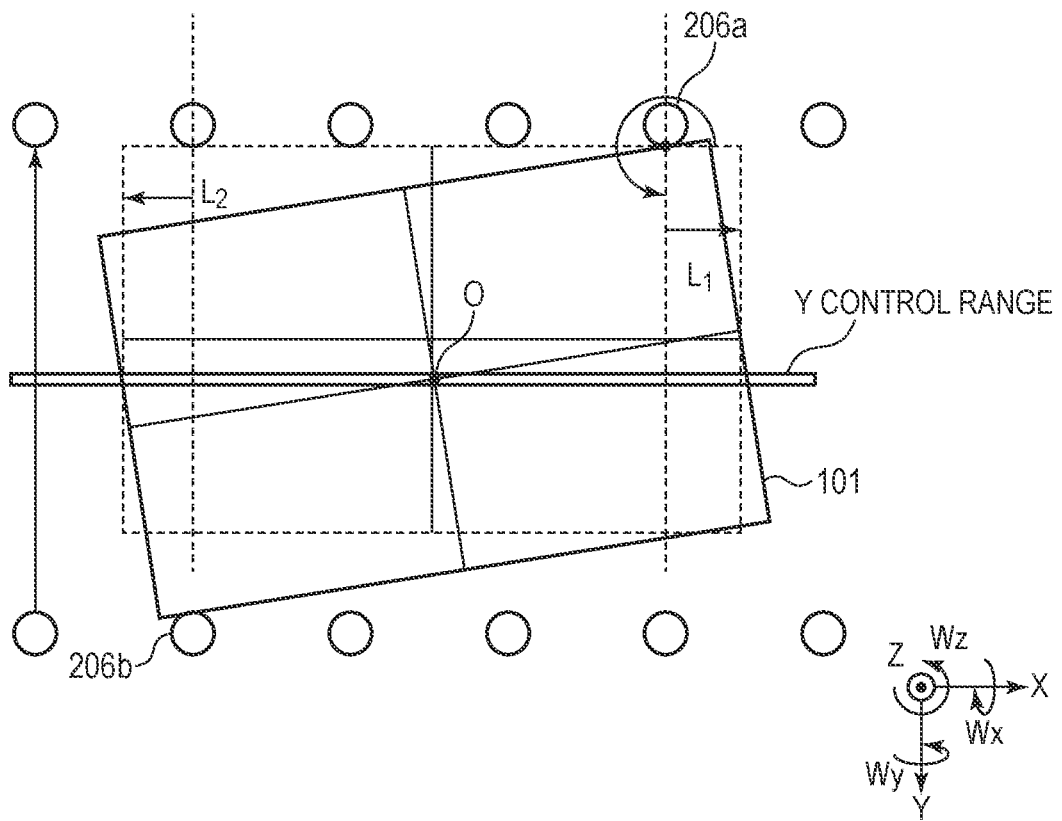

Next, the second determination condition will be described with reference to FIGS. 11A and 11B. FIGS. 11A and 11B are schematic top views for explaining a second determination condition for determining whether or not the state in which the mover 101 and the stator 201 are in contact with each other can be transitioned to a state in which the mover 101 and the stator 201 are not in contact with each other. FIGS. 11A and 11B illustrate a state in which the mover 101 rotates about a contact point between the Y roller 206a serving as a fulcrum and the mover 101, and the mover 101 abuts the Y roller 206b. FIG. 11A illustrates the positional relationship between the mover 101 and the Y rollers 206a and 206b when the center O of the mover 101 does not reach the Y control range as a result of Wz rotation centering. FIG. 11B illustrates the positional relationship between the mover 101 and the Y rollers 206a and 206b when the center O of the mover 101 reaches the Y control range as a result of Wz rotation centering.

In FIGS. 11A and 11B, a distance from a contact point between the mover 101 and the Y roller 206a serving as a fulcrum before Wz rotation centering to an end portion of the mover 101 on the positive side in the X direction is defined as L1. Further, a distance between the Y roller closest to the X direction negative side among the Y rollers in contact with the mover 101 before Wz rotation centering and an end portion of the mover 101 on the negative side in the X direction is defined as L2. In FIG. 11A, there is a difference in length between L1 and L2. In contrast, in FIG. 11B, the lengths of L1 and L2 are approximately equal.

When Wz rotation centering is performed in a positional relationship in which the lengths of L1 and L2 are different as illustrated in FIG. 11A, the vicinity of the corner of the mover 101 contacts the Y roller 206b, and the center O may not be brought close to the Y control range. Therefore, in step S3a, it is preferable to use a condition such that the difference between L1 and L2 is within a predetermined range as one of the determination conditions.

However, even when there is a difference between the lengths of L1 and L2, if the difference between the center O and the Y control range after the Wz rotation centering is minute, the center O can reach the Y control range by the process of step S6b. Therefore, although it is desirable to include it in the determination criteria in step S3a of FIG. 6, it may not be included.

The rotation direction in the Wz rotation centering illustrated in FIG. 7B or the like is a positive direction (counterclockwise) about the Wz-axis, but may be a negative direction (clockwise).

As described above, in the present embodiment, the plurality of Y rollers 206 are arranged on the stator 201. The integrated controller of the transport system controls the mover 101 to rotate about one Y roller 206a as a fulcrum when the mover 101 stops in contact with the plurality of Y rollers 206. Thus, the center O of the mover 101 can be moved within the Y control range against the magnetic attraction force to transition to the non-contact state. Therefore, according to the present embodiment, there is provided a transport system that can suitably realize transition from a state in which the mover 101 is in contact with the stator 201 to a state in which the mover 101 is not in contact with the stator 201.

Second Embodiment

This embodiment is an example of the positional relationship between the mover 101 and the Y roller 206 that can reduce the torque required for the Wz rotation centering in step S5 of FIG. 6 of the first embodiment. Description of elements common to the first embodiment may be omitted or simplified.

Figure 12:
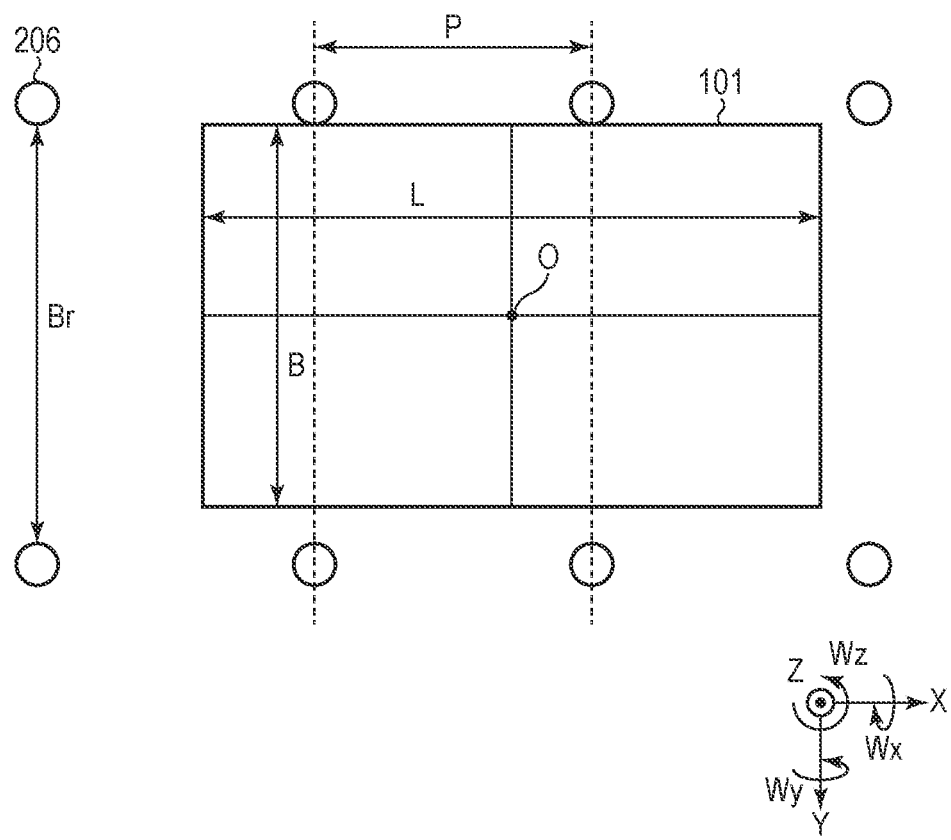
FIG. 12 is a schematic top view for defining dimensions of a mover and an arrangement of a stator according to a second embodiment.

FIG. 12 is a schematic top view for defining the dimensions of the mover 101 and the arrangement of the Y roller 206 according to the present embodiment. The Y rollers 206 are arranged at a constant interval P in the X direction. Let L be the length of the mover 101 in the X direction, and B be the length of the mover 101 in the Y direction. Further, let Br be a distance between two opposing rows of Y rollers 206.

As illustrated in FIG. 12, the mover 101 is stationary in contact with two or more Y rollers 206. The condition under which such a stationary state generally occurs is that the plurality of Y rollers 206 are arranged at an interval P equal to or less than half the length L of the mover 101. This condition is expressed by the following formula (3).

$$P \leq \frac{L}{2} \quad (3)$$

Figure 13:
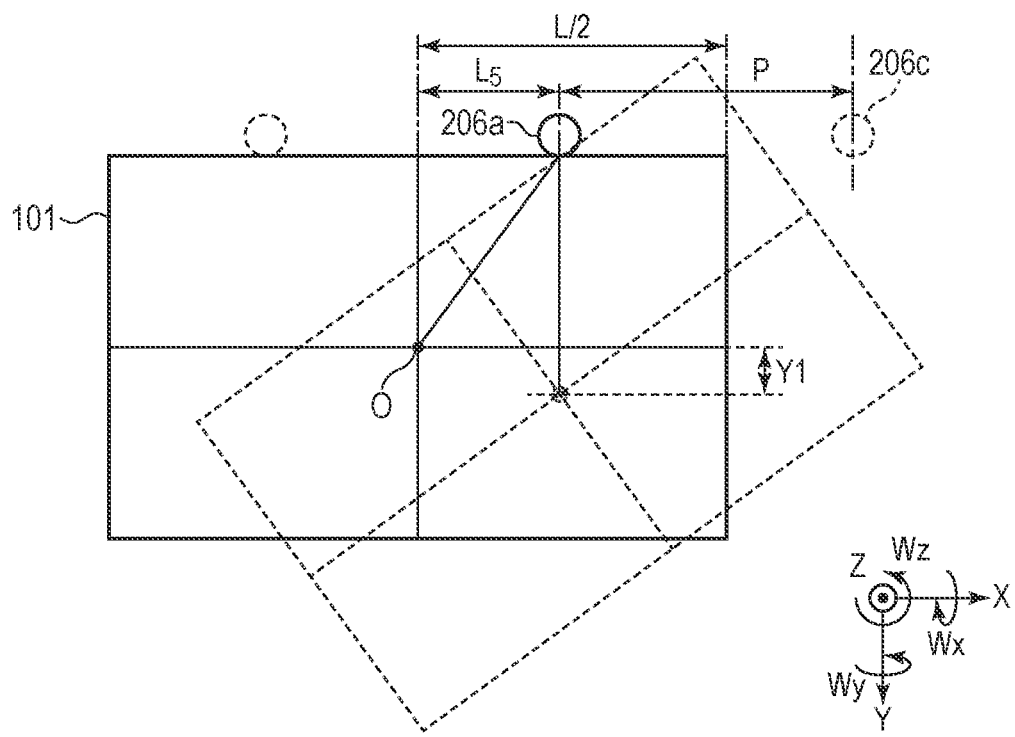
FIG. 13 is a schematic top view for explaining the positional relationship and movement of the mover and the stator according to the second embodiment.

Next, with reference to FIG. 13, the position of the Y roller 206a as the fulcrum of rotation will be described. FIG. 13 is a schematic top view for explaining the positional relationship and movement of the mover 101 and the Y roller 206a during rotation of the mover 101. Let L5 be the distance in the X direction between the center O of the mover 101 and the Y roller 206a as the fulcrum of rotation. Further, when the mover 101 rotates about the Y roller 206a, a maximum distance at which the center O of the mover 101 moves in the Y direction is defined as Y1. In this case, Y1 is expressed by the following formula (4).

$$Y1 = \sqrt{\left(\frac{B}{2}\right)^2 + L_5^2} - \left(\frac{B}{2}\right) \quad (4)$$

On the other hand, the condition of Y1 for moving the center O of the mover 101 to the center of the transport path is expressed by the following formula (5) using Br and B illustrated in FIG. 12.

$$Y1 \geq \left(\frac{B_r}{2} - \frac{B}{2}\right) \quad (5)$$

Substituting Formula (4) into Formula (5) leads to Formula (6) below.

$$\sqrt{\left(\frac{B}{2}\right)^2 + L_5^2} - \left(\frac{B}{2}\right) \geq \left(\frac{B_r}{2} - \frac{B}{2}\right) \quad (6)$$

Solving Formula (6) for L5 leads to Formula (7) below.

$$L_5 \geq \sqrt{\frac{B_r^2 - B^2}{4}} \quad (7)$$

In FIG. 13, a Y roller adjacent to the Y roller 206a is referred to as a Y roller 206c. The condition for preventing the mover 101 from contacting the Y roller 206c when the mover 101 rotates and the center O of the mover 101 moves by Y1 in the Y direction is that the sum of L5 and P is not less than half the length L of the mover 101. At this time, the condition satisfied by L5 is expressed by the following formula (8).

$$L_5 \geq \frac{L}{2} - P \quad (8)$$

Figure 14:
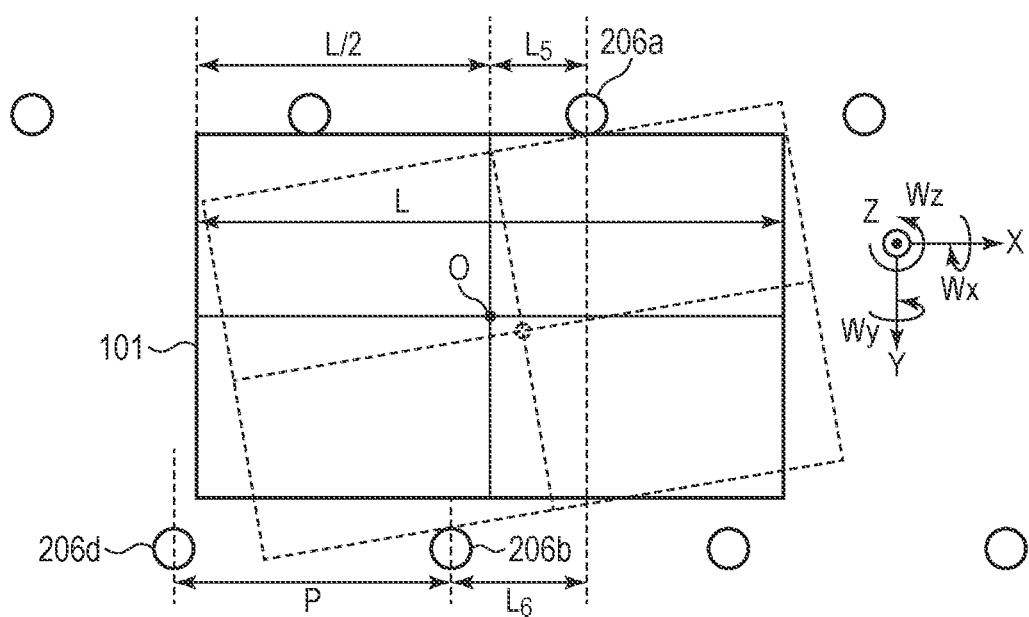
FIG. 14 is a schematic top view for explaining the positional relationship between the mover and the stator according to the second embodiment.

Next, the position of the Y roller 206b disposed at a position opposed to the Y roller 206a serving as a fulcrum will be described with reference to FIG. 14. FIG. 14 is a schematic top view for explaining the positional relationship between the mover 101 and the Y roller 206 according to the present embodiment.

When the mover 101 rotates in the direction illustrated in FIG. 14 with the contact point with the Y roller 206a as a fulcrum, the Y roller abutting on the mover 101 out of the plurality of Y rollers 206 arranged at positions opposing the Y roller 206a is defined as a Y roller 206b. A Y roller adjacent to the Y roller 206b in the negative direction of the X-axis is referred to as a Y roller 206d. When the mover 101 abuts the Y roller 206d before the mover 101 abuts the Y roller 206b when the mover 101 rotates, the rotation angle of the mover 101 becomes insufficient, and the center O of the mover 101 may not be sufficiently brought close to the Y control range. Therefore, it is preferable that the Y rollers 206 on both sides of the mover 101 be displaced in the X direction such that the Y rollers 206d do not abut on the mover 101. Thus, in the present embodiment, as illustrated in FIG. 14, the arrangement of the two rows of Y rollers is non-line-symmetrical with respect to the first direction.

Assuming that the distance between the Y roller 206a and the Y roller 206b in the X direction is L6, the Y roller 206d is positioned away from the Y roller 206a by L6+P in the negative direction of the X-axis. The end portion of the mover 101 is located away from the Y roller 206a by L5+L/2 in the negative direction of the X-axis. Therefore, a condition for preventing the mover 101 from abutting on the Y roller 206d when the mover 101 rotates is expressed by the following formula (9).

$$L_6 + P \geq L_5 - \frac{L}{2} \quad (9)$$

Figure 15:
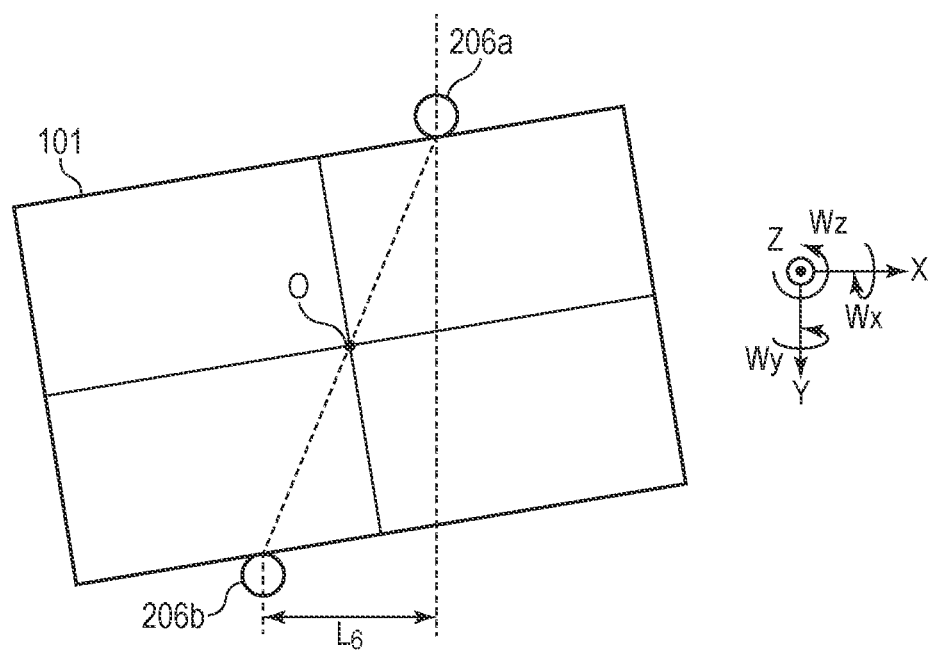
FIG. 15 is a schematic top view for explaining the positional relationship between stators according to the second embodiment.

Next, the optimal value of L6 will be described with reference to FIG. 15. FIG. 15 is a schematic top view for explaining the positional relationship between the Y rollers 206 according to the present embodiment. FIG. 15 illustrates a state in which the Y roller 206a and the Y roller 206b are located in a point-symmetrical position with respect to the center O of the mover 101 after rotation. In this state, the center O of the mover 101 is at an intermediate position between the Y roller 206a and the Y roller 206b in the Y direction. With this positional relationship, the center O of the mover 101 reaches the center of the Y control range after rotation of the mover 101. The condition of L6 that can realize the state of FIG. 15 is expressed by the following formula (10).

$$L_6 = 2\sqrt{L_5^2 + \left(\frac{B}{2}\right)^2 - \left(\frac{B_r}{2}\right)^2} \quad (10)$$

However, L6 does not necessarily have to completely match the value indicated in formula (10), and can be appropriately set such that the center O of the mover 101 can reach the Y control range.

Next, the relationship between the Wz torque and L5 will be described with reference to FIG. 16. FIG. 16 is a schematic top view for explaining the relationship between the positional relationship between the mover 101 and the Y roller 206a and the torque according to the embodiment.

As illustrated by arrows in FIG. 16, the magnetic attraction force in the Y direction acting on the mover 101 in the range of L/2–L5 from the Y roller 206a in the positive direction of the X-axis is canceled by the magnetic attraction force in the Y direction acting on the mover 101 in the range of L/2–L5 in the negative direction. Therefore, the magnetic attraction force in the shaded range in FIG. 16 does not generate the Wz torque during the Wz rotation centering. Among the magnetic attraction forces acting on the mover 101 in the Y direction, the range contributing to the Wz torque around the contact point between the Y roller 206a and the mover 101 is only the magnetic attraction force generated outside the hatching range, i.e., the range indicated by 2×L5 in FIG. 16. When the mover 101 is rotated about a point of contact with the Y roller 206a as a fulcrum, a Wz torque against the magnetic attraction force generated in the range of 2×L5 is applied to the mover 101, whereby the mover 101 can be rotated in the positive direction of the Wz-axis.

Therefore, the smaller L5 is, the smaller the Wz torque for rotating the mover 101 can be. Accordingly, by setting L5 to a minimum within a range satisfying any of the above conditional formulas, the Wz torque required for transitioning the mover 101 from the contact state to a state in which the mover 101 can be transported in a non-contact state can be minimized.

As described above, in the present embodiment, there is provided the transport system that can more suitably realize the transition from the state in which the mover 101 is in contact with the stator 201 to the state in which the mover 101 is not in contact with the stator 201. Note that none of the conditions described in the present embodiment is essential. The transport system may be configured to satisfy some of the conditions described in the present embodiment.

Third Embodiment

Although the Y roller 206 is disposed on the stator 201 in the above-described embodiment, the present invention is not limited to this, and the Y roller 206 may be disposed on the mover 101. In the present embodiment, an example in which the Y roller 206 is disposed on the mover 101 will be described. Description of elements common to the first embodiment or the second embodiment may be omitted or simplified.

Figure 17:
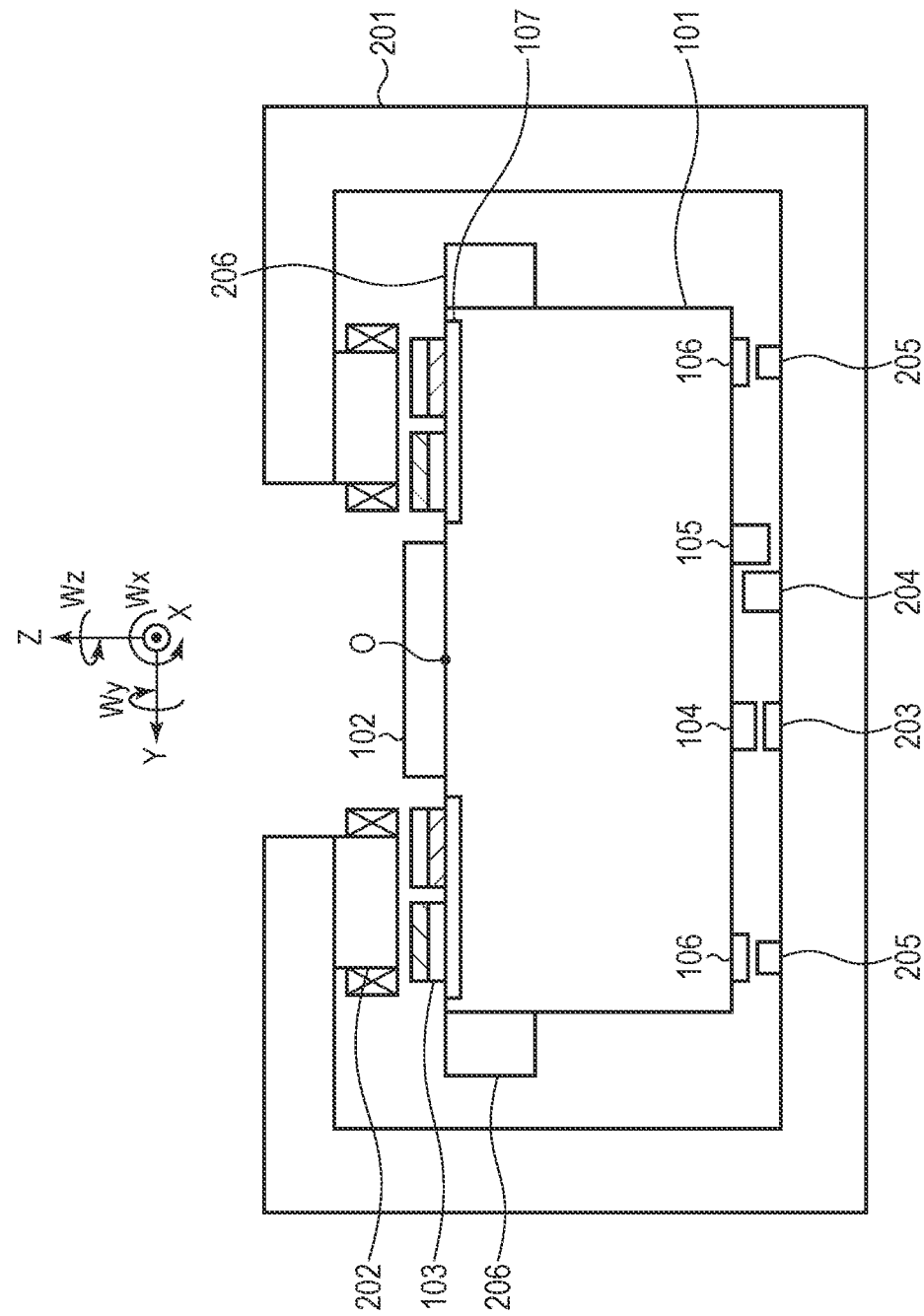
FIG. 17 is a schematic cross-sectional view illustrating an overall configuration of a transport system according to a third embodiment.

FIG. 17 is a schematic cross-sectional view illustrating an overall configuration of a transport system according to the present embodiment. As illustrated in FIG. 17, in the present embodiment, Y rollers 206 are arranged on both side surfaces of the mover 101 in the Y direction. Other configurations are the same as those in FIG. 1, and thus description thereof will be omitted.

Figure 18:
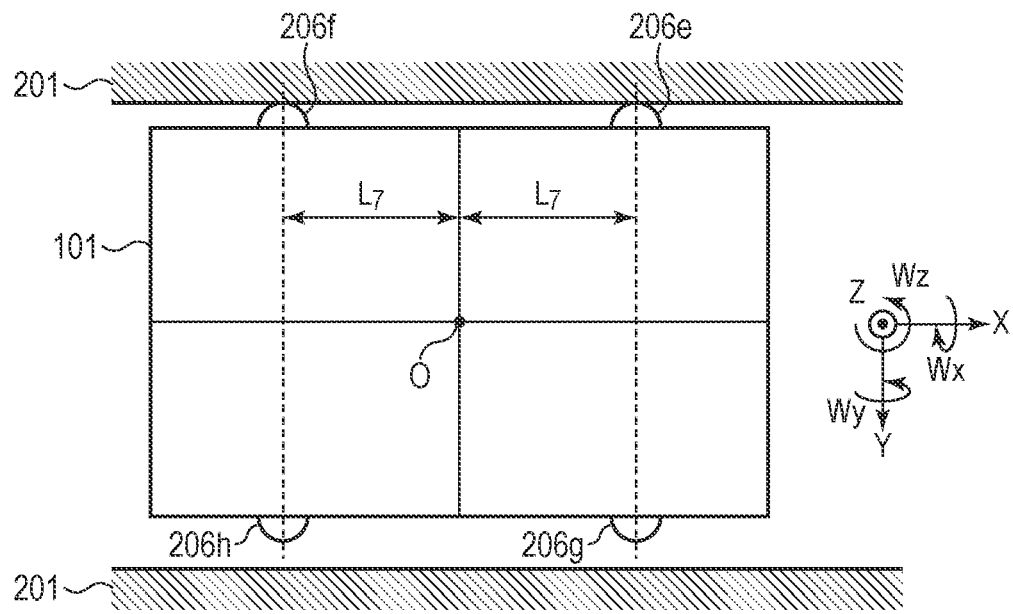
FIG. 18 is a schematic top view illustrating an overall configuration of a transport system according to a third embodiment.

FIG. 18 is a schematic top view illustrating the overall configuration of the transport system according to the present embodiment. The mover 101 is provided with Y rollers 206e, 206f, 206g and 206h. Y rollers 206e and 206f are disposed on one surface of the mover 101 located on the negative side in the Y direction, and Y rollers 206g and 206h are disposed on the other surface of the mover 101 located on the positive side in the Y direction. As illustrated in FIG. 18, at least two Y rollers may be disposed on each of the two faces of the mover 101 opposed to each other in the Y direction, but more than two Y rollers may be disposed.

The stator 201 has a side wall on which the Y roller 206e, 206f, 206g, and 206h disposed on the mover 101 can come into contact when the mover 101 is stopped. As illustrated in FIG. 18, when the mover 101 comes into contact with the negative side wall in the Y direction and stops, Y rollers 206e and 206f disposed on the negative side surface in the Y direction of the mover 101 come into contact with the stator 201. In the state of FIG. 18, since the mover 101 is in contact with the side wall of the stator 201 via the Y rollers 206e and 206f, the mover 101 can freely move in the X direction along the side wall. When the mover 101 comes into contact with the side wall on the positive side in the Y direction and stops, Y rollers 206g and 206h arranged on the surface on the positive side in the Y direction of the mover 101 come into contact with the stator 201.

Figure 19:
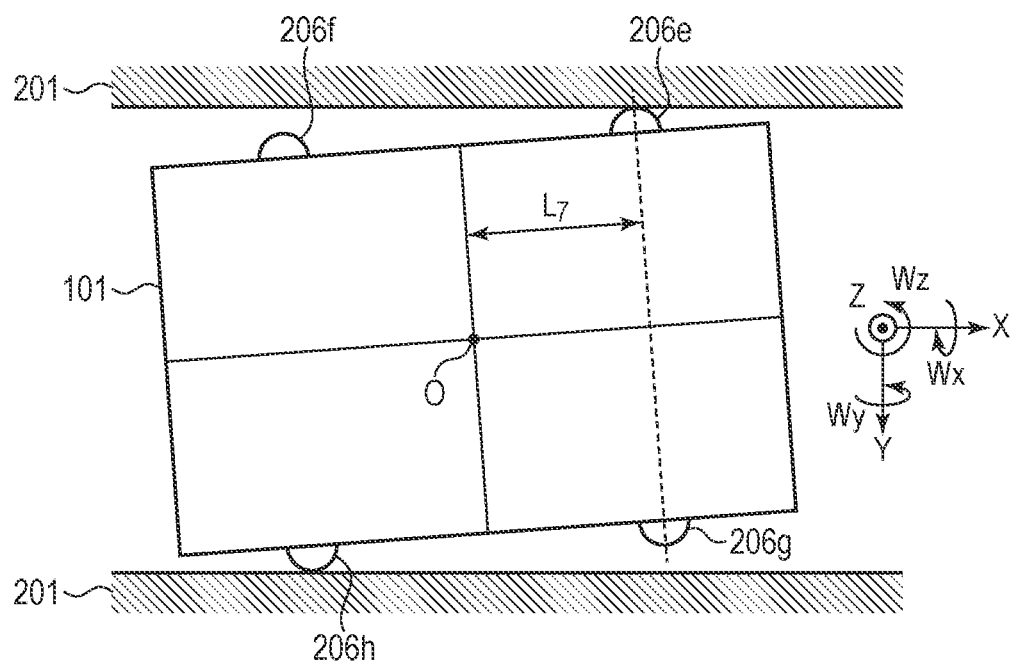
FIG. 19 is a schematic top view for explaining a state during Wz rotation centering according to the third embodiment.

FIG. 19 is a schematic top view for explaining a state during Wz rotation centering according to the present embodiment. Also in the present embodiment, the mover 101 can be transitioned to a state in which it is not in contact with the stator 201 by the same processing as in FIG. 6 of the first embodiment. That is, also in the configuration of the present embodiment, Wz rotation centering around the contact point between the Y roller 206e and the side wall of the stator 201 can be performed in the same manner as in the first embodiment in the manner illustrated in FIG. 19.

Let L7 be the distance in the X direction from the center O of the mover 101 to the Y rollers 206e, 206f, 206g, and 206h. As described with reference to FIG. 16 in the second embodiment, the Wz torque required for rotation of the mover 101 increases as L7 increases. Therefore, L7 is set such that the Wz torque required for rotation of the mover 101 is smaller than the Wz torque that can be generated.

However, in the present embodiment, since the Y rollers 206e, 206f, 206g, and 206h are disposed on the mover 101, L7 does not depend on the position of the mover 101 in the X direction. Therefore, in the present embodiment, the restriction condition related to the position in the X direction or the process of changing the position in the X direction as described in the first embodiment or the second embodiment is not necessary. That is, in the present embodiment, the process of transition from the state in which the mover 101 is in contact with the stator 201 to the state in which the mover 101 is not in contact with the stator 201 can be performed without depending on the position in the X direction. Therefore, in the present embodiment, control is simplified compared to the first embodiment and the second embodiment.

As described above, according to the present embodiment, there is provided a transport system that can suitably realize transition from a state in which the mover 101 is in contact with the stator 201 to a state in which the mover 101 is not in contact with the stator 201.

Figure 20A:
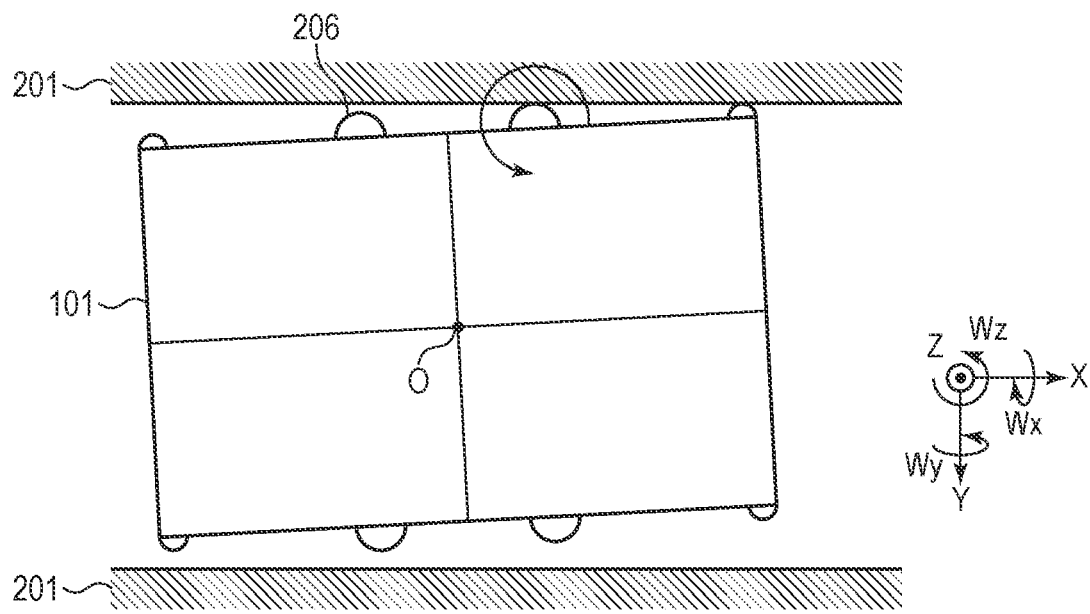
FIGS. 20A and 20B are schematic top views illustrating the overall configuration of a transport system according to a modified example of the third embodiment.
Figure 20B:
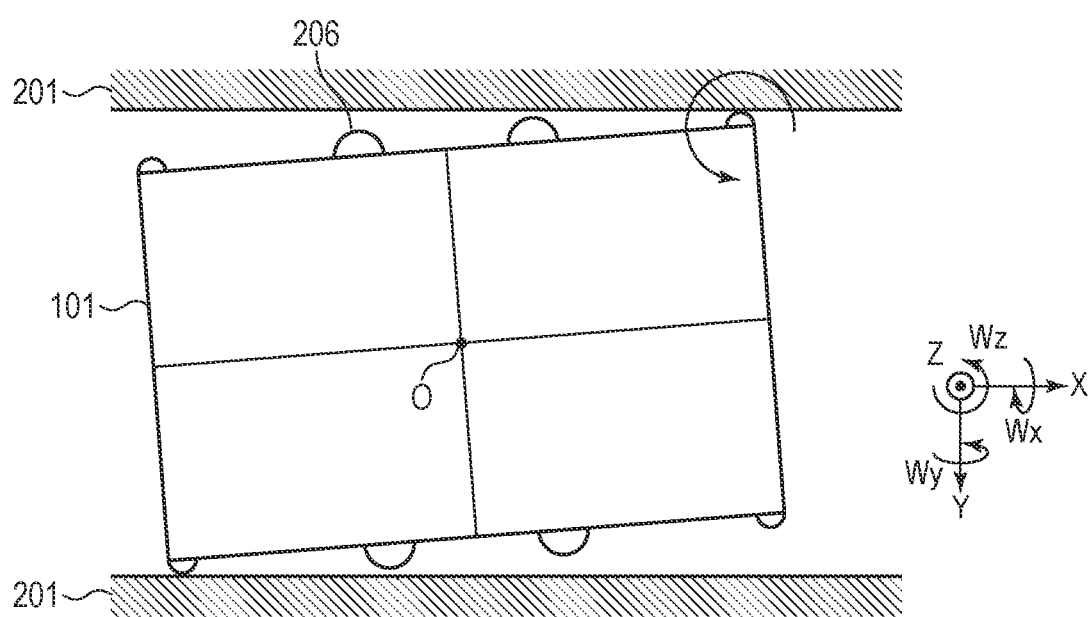

FIGS. 20A and 20B are schematic top views illustrating the overall configuration of a transport system according to a modified example of the third embodiment. As illustrated in FIGS. 20A and 20B, the mover 101 is provided with a plurality of Y rollers 206 having different sizes. Thus, in this modified example, the Wz rotation centering process can be performed separately in the first stage illustrated in FIG. 20A and the second stage illustrated in FIG. 20B. In the first stage illustrated in FIG. 20A and the second stage illustrated in FIG. 20B, the Y rollers 206 serving as the rotation center are different. As described above, in the third embodiment, as illustrated in FIGS. 20A and 20B, the Y roller 206 serving as the fulcrum may change in the process of Wz rotation centering.

Fourth Embodiment

Figure 21:
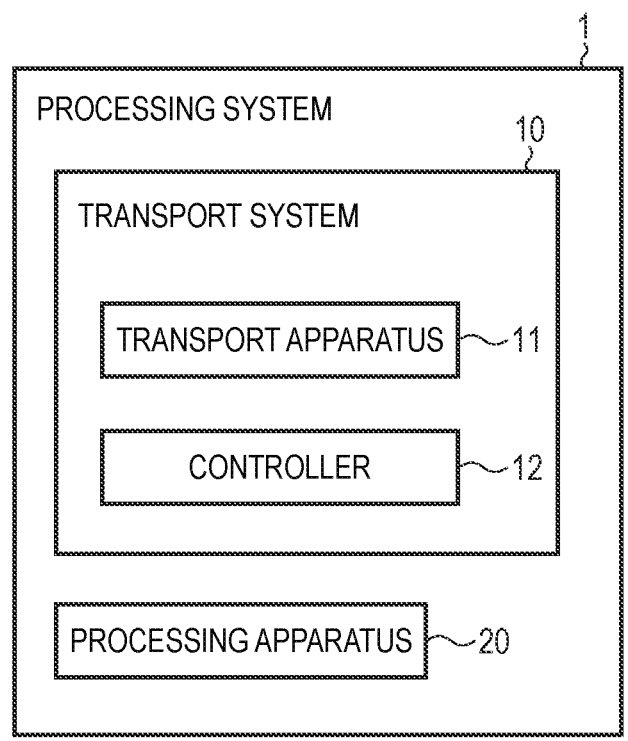
FIG. 21 is a block diagram illustrating a configuration of a processing system according to a fourth embodiment.

FIG. 21 is a block diagram illustrating a configuration of the processing system 1 according to the present embodiment. A processing system 1 illustrated in FIG. 21 is an apparatus having the transport system according to the first to third embodiments described above. That is, the processing system 1 according to the present embodiment is an example of an apparatus to which the transport systems according to the first to third embodiments can be applied.

The processing system 1 includes a transport system 10 according to the first to third embodiments and a processing apparatus 20. The transport system 10 includes a transport apparatus 11 including the mover 101, the stator 201, the Y roller 206, and the like described in the first to third embodiments, and a controller 12 which is the integrated controller described in the first to third embodiments. The transport apparatus 11 is controlled by the controller 12.

The processing apparatus 20 is an apparatus for manufacturing an article by processing on a workpiece. The application of the processing apparatus 20 is not particularly limited, but may be, for example, an assembly apparatus for industrial products, an evaporation apparatus for forming a thin film on a substrate as a workpiece, a film forming apparatus such as a sputtering apparatus, or an exposure apparatus for photolithography. A film forming apparatus such as an evaporation apparatus or a sputtering apparatus is provided in a vacuum apparatus. The film to be formed is, for example, a thin film, and its raw material is an organic material or a metal material (metal or metal oxide). The transport system 10 transports a workpiece such as a component, a semi-finished product, or a semiconductor substrate to the processing apparatus 20. The workpiece is transported into the processing apparatus 20 by the mover 101. The processing apparatus 20 processes a workpiece. An article manufactured by performing film formation on a substrate such as a glass substrate as a workpiece is, for example, an organic electronic device such as an organic EL display device or a thin-film solar cell. The organic EL display device is used, for example, in a display panel of a mobile device such as a smartphone.

In general, if a guide device having a sliding portion is used in the processing apparatus 20 as described above, contaminants generated from the sliding portion may deteriorate productivity. Examples of such contaminants include rail and bearing wear pieces, lubricating oil, and volatiles of lubricating oil. The transport system 10 according to the first to third embodiments can reduce the generation of contaminants by transporting a workpiece in a non-contact manner. Therefore, the processing system 1 of the present embodiment is more effective in applications requiring cleanliness such as an industrial product assembly process and a semiconductor device manufacturing process.

According to the present embodiment, the processing system 1 to which the transport system 10 according to the first to third embodiments is applied is provided.

Other Embodiments

It should be noted that all of the above-described embodiments are merely examples of implementation for carrying out the present invention, and the technical scope of the present invention should not be construed as being limited thereto. For example, although the above embodiment has been described by way of example with the mover 101 is in contact with the stator 201 and stopped, the mover 101 need not be completely stopped, and the present invention can also be applied even when the mover 101 in contact with the stator 201 without stopping. The hardware configuration, software configuration, processing flow, dimensions, shape, and the like in the above description do not limit the scope of the present invention. That is, the present invention can be implemented in various forms without departing from the technical idea thereof or the main characteristics thereof. For example, it is to be understood that an embodiment in which a part of the configuration of any of the embodiments is added to another embodiment or an embodiment in which a part of the configuration of any of the other embodiments is substituted is also an embodiment to which the present invention can be applied.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-182799, filed Oct. 30, 2020, which is hereby incorporated by reference herein in its entirety.

What is claimed is:

1. A transport system comprising:
   a stator having a first magnetic force unit;
   a mover having a second magnetic force unit; and
   a control unit,
   wherein the control unit controls a magnetic force acting between the first magnetic force unit and the second magnetic force unit to transport the mover in a first direction, the mover being transported relative to the stator in a floating state,
   wherein the stator has a first regulating member row including a plurality of first regulating members and a second regulating member row including a plurality of second regulating members, the mover, in a second direction intersecting the first direction, being disposed between the first regulating member row and the second regulating member row, and
   wherein the control unit performs a first process of applying a rotational force to the mover such that one of the first regulating members in the first regulating member row serves as a fulcrum when the mover contacts the first regulating member row, and the mover and the plurality of first regulating members transitioning to a non-contact state after the first process.

2. The transport system according to claim 1,
wherein the mover abuts against at least one of the second regulating member in the second regulating member row after the first process.

3. The transport system according to claim 1,
wherein the control unit performs a second process of moving the mover in the first direction when the position of the mover in the first direction before performing the first process is a position at which the first process cannot be performed.

4. The transport system according to claim 1,
wherein the control unit performs a third process of adjusting the position of the mover when the position of the mover after the first process is a position at which movement of the mover in the second direction cannot be performed.

5. The transport system according to claim 1,
wherein the control unit performs a fourth process of applying a rotational force in a direction opposite to that in the first process to the mover after the first process.

6. The transport system according to claim 1,
wherein the plurality of first regulating members and the plurality of second regulating members are arranged non-line-symmetrically with respect to the first direction.

7. A transport system comprising:
a stator having a first magnetic force unit;
a mover having a second magnetic force unit; and
a control unit,
wherein the control unit controls a magnetic force acting between the first magnetic force unit and the second magnetic force unit to transport the mover in a first direction, the mover being transported relative to the stator in a floating state,
wherein the mover has two side surfaces in a second direction intersecting the first direction and has a plurality of first regulating members disposed on one side surface and a plurality of second regulating members disposed on the other side surface of the mover, and
wherein the control unit performs a first process of applying a rotational force to the mover such that one of the first regulating members of the first regulating member row serves as a fulcrum when the first regulating member row of the mover contacts the stator, and the mover and the plurality of first regulating members transitioning to a non-contact state after the first process.

8. The transport system according to claim 7,
wherein the first regulating member row includes first regulating members different in size from each other.

9. The transport system according to claim 1,
wherein the first magnetic force unit includes a coil, and
wherein the second magnetic force unit includes a permanent magnet.

10. The transport system according to claim 1,
wherein each of the plurality of first regulating members and the plurality of second regulating members is a roller.

11. The transport system according to claim 1 includes a plurality of sets of the first magnetic force unit and the second magnetic force unit, the first magnetic force unit and the second magnetic force unit generating magnetic forces in different directions each other.

12. A processing system comprising:
the transport system according to claim 1; and
a processing apparatus that performs processing on a workpiece transported by the mover.

13. An article manufacturing method for manufacturing an article by using the processing system according to claim 12, the article manufacturing method comprising:
transporting the workpiece by the mover; and
performing, by using the processing apparatus, the processing on the workpiece transported by the mover.

14. A control method of a transport system including a stator having a first magnetic force unit; a mover having a second magnetic force unit; and a control unit, wherein the control unit controls a magnetic force acting between the first magnetic force unit and the second magnetic force unit to transport the mover in a first direction, the mover being transported relative to the stator in a floating state, and wherein the stator has a first regulating member row including a plurality of first regulating members and a second regulating member row including a plurality of second regulating members, the mover, in a second direction intersecting the first direction, being disposed between the first regulating member row and the second regulating member row, the control method comprising:
preforming a first process of applying a rotational force to the mover such that one of the first regulating members of the first regulating member row serves as a fulcrum when the mover contacts the first regulating member row, and the mover and the plurality of first regulating members transitioning to a non-contact state after the first process.

* * * * *